United States Patent
Matsuda

(10) Patent No.: US 7,574,083 B2
(45) Date of Patent: Aug. 11, 2009

(54) OPTICAL DEVICE HAVING DIFFRACTION GRATINGS COUPLING GUIDED WAVE, AND ITS MANUFACTURE METHOD

(75) Inventor: Manabu Matsuda, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 12/068,271

(22) Filed: Feb. 5, 2008

(65) Prior Publication Data

US 2008/0199131 A1    Aug. 21, 2008

(30) Foreign Application Priority Data

Feb. 16, 2007   (JP) ............................. 2007-036158

(51) Int. Cl.
*G02B 6/34* (2006.01)
(52) U.S. Cl. ........................................ 385/37
(58) Field of Classification Search ............ 385/37, 385/129–132
See application file for complete search history.

(56) References Cited

U.S. PATENT DOCUMENTS

2008/0069496 A1 *  3/2008  Tolstikhin et al. ............ 385/30

FOREIGN PATENT DOCUMENTS

JP       2003-152273       5/2003

* cited by examiner

*Primary Examiner*—Sarah Song
(74) *Attorney, Agent, or Firm*—Kratz, Quintos & Hanson, LLP

(57) ABSTRACT

An optical waveguide structure formed over a substrate defines an optical waveguide for guiding light along a direction parallel to the substrate surfaces, and biasing a light intensity distribution of transverse modes of guided wave toward a first side of the optical waveguide path. A main diffraction grating is disposed at least on a second side opposite to the first side, and coupled with the guided wave propagating along the optical waveguide. A subsidiary diffraction grating is disposed on the first side, and diffracts the guided wave coupled with the main diffraction grating and propagating along the optical waveguide, to a direction different from an extending direction of the optical waveguide.

16 Claims, 27 Drawing Sheets

US 7,574,083 B2

OPTICAL DEVICE HAVING DIFFRACTION GRATINGS COUPLING GUIDED WAVE, AND ITS MANUFACTURE METHOD

CROSS REFERENCE TO RELATED APPLICATION

This application is based on and claims priority of Japanese Patent Application No. 2007-036158 filed on Feb. 16, 2007, the entire contents of which are incorporated herein by reference.

BACKGROUND OF THE INVENTION

A) Field of the Invention

The present invention relates to an optical device and its manufacture method, and more particularly to an optical device having diffraction gratings coupling guided wave propagating in an optical waveguide.

B) Description of the Related Art

With an explosive increase in demand for Internet, ultra high speed and large capacity have been studied vigorously in the fields of optical communications and transmissions. Inexpensive semiconductor laser devices capable of direct modulation at a frequency not lower than 10 Gb/s without cooling have been desired, particularly for Ethernet (registered trademark) having a giga bit transmission band. A semiconductor laser device meeting these needs includes a distributed feedback (DFB) type laser device.

In order to manufacture a DFB laser device with low cost, a ridge type laser device is promising which can be manufactured by crystal growth in a single process, i.e., which does not require another process for crystal growth after an etching process. It is advantageous from the viewpoint of manufacture cost that diffraction gratings for distributed feedback of a ridge type laser device are formed not in a bosom of a crystal but on both sides of the ridge.

FIG. 16 is a perspective view of a conventional ridge type DFB laser device. On a semiconductor substrate 500, an active layer 501 and a cladding layer 502 are sequentially stacked. A ridge 503 extending in one direction is formed on the clad layer 502. Diffraction gratings 504 are formed on the sidewalls of the ridge 503. Part of the active region 501 down below the ridge 503 serves as an optical waveguide.

FIG. 17 shows another example of a conventional ridge type DFB laser device. In the ridge type DFB laser device shown in FIG. 16, the diffraction gratings 504 are formed on the sidewalls of the ridge 503, and in the example shown in FIG. 17, diffraction gratings 504A are formed on a flat surface on both sides of the ridge 503, substituting for the diffraction gratings 504. The other structures are the same as those of the laser device shown in FIG. 16.

FIG. 18 shows a positional relation between guided wave propagating in an optical waveguide and diffraction gratings. The diffraction gratings 504 or 504A are disposed on both sides of the ridge 503. A light intensity distribution of a guided wave in the fundamental transverse mode has a maximum intensity at the center of the ridge 503 in a width direction, and the light intensity lowers as the distance from the center, as indicated by a solid line 510. A light intensity distribution in the first higher order transverse mode (hereinafter abbreviated to "second-order transverse mode") has a minimum intensity at the center of the ridge 503 in a width direction, the light intensity increases as the distance from the center, and the light intensity distribution has maximum intensities on both sides of the center, as indicated by a solid line 511. In the region outside the maximum intensity positions, a light intensity lowers monotonously as the distance from the center of the ridge 503. No diffraction grating is disposed near the center of the ridge 503 but the diffraction gratings are disposed on both sides of the ridge 503. A light intensity of the second-order transverse mode is therefore stronger than that of the fundamental transverse mode, in the regions where the diffraction gratings are disposed. Therefore, a coupling coefficient between the second-order transverse mode and the diffraction gratings is about 1.5 to 2 times as large as that between the fundamental transverse mode and the diffraction gratings. Oscillation of the second-order transverse mode is therefore likely to occur.

In order to lower the coupling coefficient between the second-order transverse mode and the diffraction gratings, it is effective to make the ridge 503 narrower to set the diffraction gratings near at the center of the ridge 503. However, as the ridge 503 is made narrow, an electric resistance of the laser device increases. Narrowing the ridge 503 may cause an increase in consumption power and a reduction in optical output due to heat generation when large current is injected.

JP-A-2003-152273 discloses a semiconductor laser device capable of suppressing high-order transverse modes.

FIG. 19 is a plan cross sectional view of a ridge portion of a semiconductor laser device disclosed in JP-A-2003-152273. Diffraction gratings 521 are formed on the sidewalls of a ridge 520. A light absorption layer 522 made of InGaAs having absorbability of oscillation light is formed on concave/convex outer surfaces of the diffraction gratings 522. Since the light absorption layer 522 absorbs the high-order transverse modes more than the fundamental transverse mode, oscillation of the high-order transverse modes can be suppressed.

SUMMARY OF THE INVENTION

According to one aspect of an embodiment, there is provided an optical device having:

an optical waveguide structure formed over a substrate, the optical waveguide structure defining an optical waveguide for guiding light along a direction parallel to a surface of the substrate, and biasing a light intensity distribution of transverse modes of guided wave toward a first side of the optical waveguide;

a main diffraction grating disposed at least on a second side opposite to the first side among both sides of the optical waveguide, and coupled with the guided wave propagating along the optical waveguide; and a subsidiary diffraction grating disposed on the first side among both sides of the optical waveguide, and diffracting the guided wave that is coupled with the main diffraction grating and propagates along the optical waveguide, to a direction different from an extending direction of the optical waveguide.

According to another aspect of an embodiment, there is provided a manufacture method for an optical device including steps of:

forming, over a lower cladding layer, a waveguide layer having an effective refractive index higher than an effective refractive index of the lower cladding layer;

forming, over the waveguide layer, an upper cladding layer having an effective refractive index higher than an effective refractive index of the waveguide layer;

forming a first diffraction grating pattern having periodicity in a first direction, over the upper cladding layer, by interference exposure;

covering the first diffraction grating pattern disposed in a region on one side of a border line parallel to the first direction, with a mask film;

removing the first diffraction grating pattern in a region not covered with the mask film;

forming a second diffraction grating pattern having periodicity along the first direction over the upper cladding layer and the mask film, by interference exposure;

removing the mask film together with the second diffraction grating pattern formed thereon;

forming a ridge pattern covering a stripe area extending in the first direction, the ridge pattern superposing at least partially upon the first diffraction grating; and etching the upper cladding layer by using as an etching mask the first and second diffraction grating patterns and the ridge pattern.

DESCRIPTION OF THE PREFERRED EMBODIMENTS

Prior to describing embodiments, a ridge type laser device proposed previously by the present inventor will be described with reference to FIGS. 1 to 3.

Figure 1:
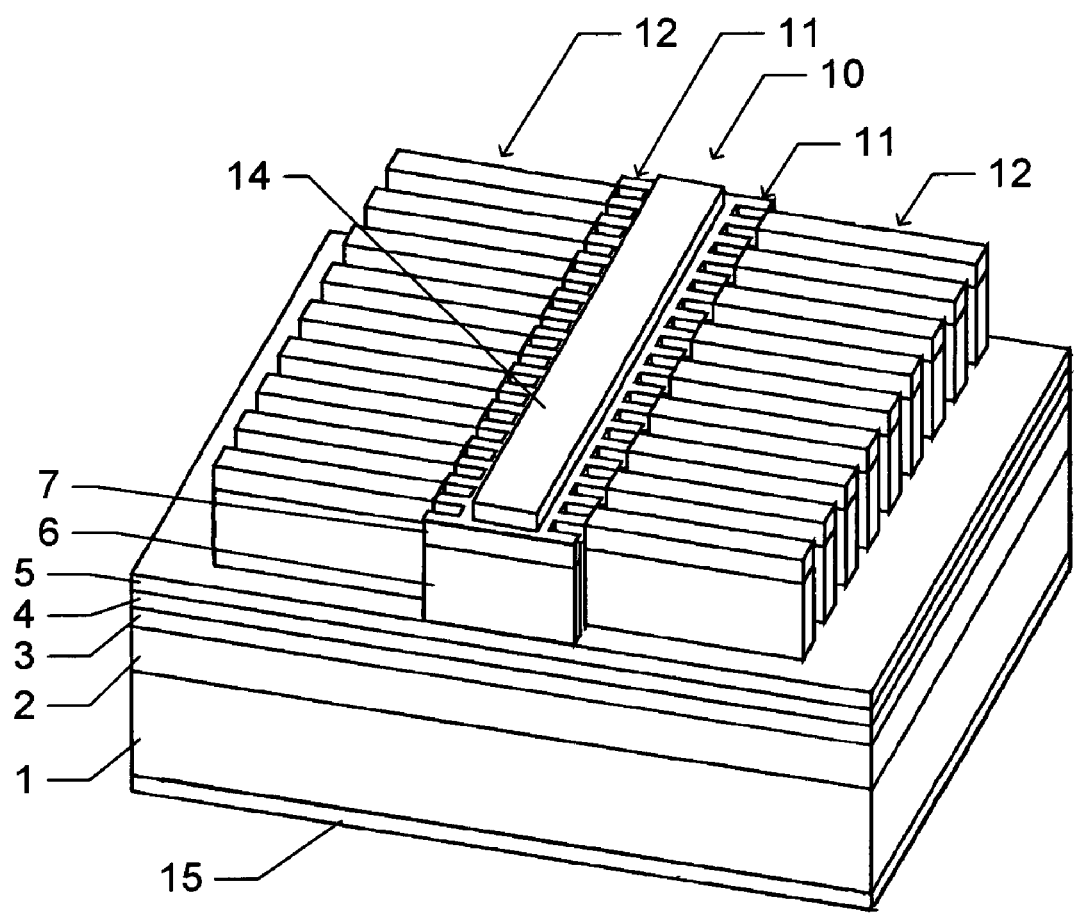
FIG. 1 is a perspective view of a ridge type laser device proposed previously by the present inventor.

FIG. 1 is a perspective view of the previously proposed ridge type laser device. A lower cladding layer 2 made of n-type $Al_{0.5}Ga_{0.5}As$ and having a thickness of 1.5 µm, a lower optical guide layer 3 made of n-type $Al_{0.3}Ga_{0.7}As$ and having a thickness of 0.15 µm, a quantum dot active layer (optical waveguide layer) 4, and an upper optical guide layer 5 made of p-type $Al_{0.3}Ga_{0.7}As$ and having a thickness of 0.15 µm are sequentially stacked in this order on the principal surface of a substrate 1 made of n-type GaAs.

The quantum dot active layer 4 has a lamination structure that a structure of an InGaAs layer having a number of quantum dots of InAs sandwiched between GaAs layers is repeated ten times in a thickness direction.

A ridge 10 which is long in one direction and has a height of 1.4 µm and a width of 2 µm is disposed on the upper optical guide layer 5. Main diffraction gratings 11 having periodicity in a lengthwise direction of the ridge 10 are formed on both sidewalls of the ridge 10. The main diffraction grating 11 has a structure that a convex portion and a concave portion extending in a height direction of the ridge 10 are alternately disposed in the lengthwise direction of the ridge 10. A period of the main diffraction grating 11 is 198 nm, and a height from the bottom of the concave portion to the top of the concavity portion is 500 nm.

The ridge 10 has a two-layer structure consisting of an upper cladding layer 6 and a contact layer 7 formed on the upper clad layer 6. The upper cladding layer 6 is made of p-type $Al_{0.3}Ga_{0.7}As$ and has a thickness of 1.2 µm. The contact layer 7 is made of p-type GaAs and has a thickness of 0.2 µm.

A subsidiary diffraction grating 12 having periodicity in the lengthwise direction of the ridge 10 is formed on flat surfaces of the upper optical guide layer 5 on both sides of the ridge 10. The subsidiary diffraction grating 12 consists of a number of convex portions disposed at even intervals in the lengthwise direction of the ridge 10. A period of the subsidiary diffraction grating 12 is 396 nm, i.e., a twofold of that of the main diffraction grating 11. The convex portions constituting the subsidiary diffraction grating 12 have the same two-layer structure as that of the ridge 10, and the height thereof is the same as that of the ridge 10. A size of the convex portion in the lengthwise direction of the ridge 10 is 198 nm. A size of the convex portion in the direction perpendicular to the lengthwise direction of the ridge 10 is 0.5 µm.

The convex portions of the subsidiary diffraction grating 12 may be disposed, with the end faces contacting the front faces of the convex portions of the main diffraction grating 11, or with a fine clearance between the end faces and the front faces of the convex portions of the main diffraction grating 11.

An upper electrode 14 is formed on the ridge 10. A lower electrode 15 is formed on the bottom of the substrate 1. The upper and lower electrodes 14 and 15 are made of AuZn/Au, for example. A semiconductor surface of the laser device is generally covered with a protective film made of silicon oxide, silicon nitride, benzocyclobutene (BCB) or the like.

The quantum dot active layer 4 has an effective refractive index higher than any one of refractive indices of the lower cladding layer 2, lower optical guide layer 3, upper optical guide layer 5 and upper cladding layer 6. A region of the quantum dot active layer 4 down below the ridge 10 serves as an optical waveguide for guiding light in the lengthwise direction of the ridge 10. Guided wave propagating along the optical waveguide is coupled with the main diffraction gratings 11 and subsidiary diffraction gratings 12.

A wavelength λ of a guided wave selected by the main diffraction gratings 11 is represented by:

$$\lambda = 2 \times p_1 \times n_e$$

where $n_e$ is an equivalent refractive index of the optical waveguide and $p_1$ is a period of the main diffraction gratings 11. When voltage is applied across the upper electrode 14 and lower electrode 15, carriers are injected into the quantum dot active layer 4 and the ridge type laser device oscillates at a wavelength λ given by the above formula.

In FIG. 1, the main and subsidiary diffraction gratings 11 and 12 are drawn in such a manner that the periods thereof are relatively longer compared to the size of the whole laser device. Also in other drawings accompanying this specification, diffraction gratings are drawn in such a manner that the periods thereof are relatively longer compared to the size of the whole laser device.

Figure 2:
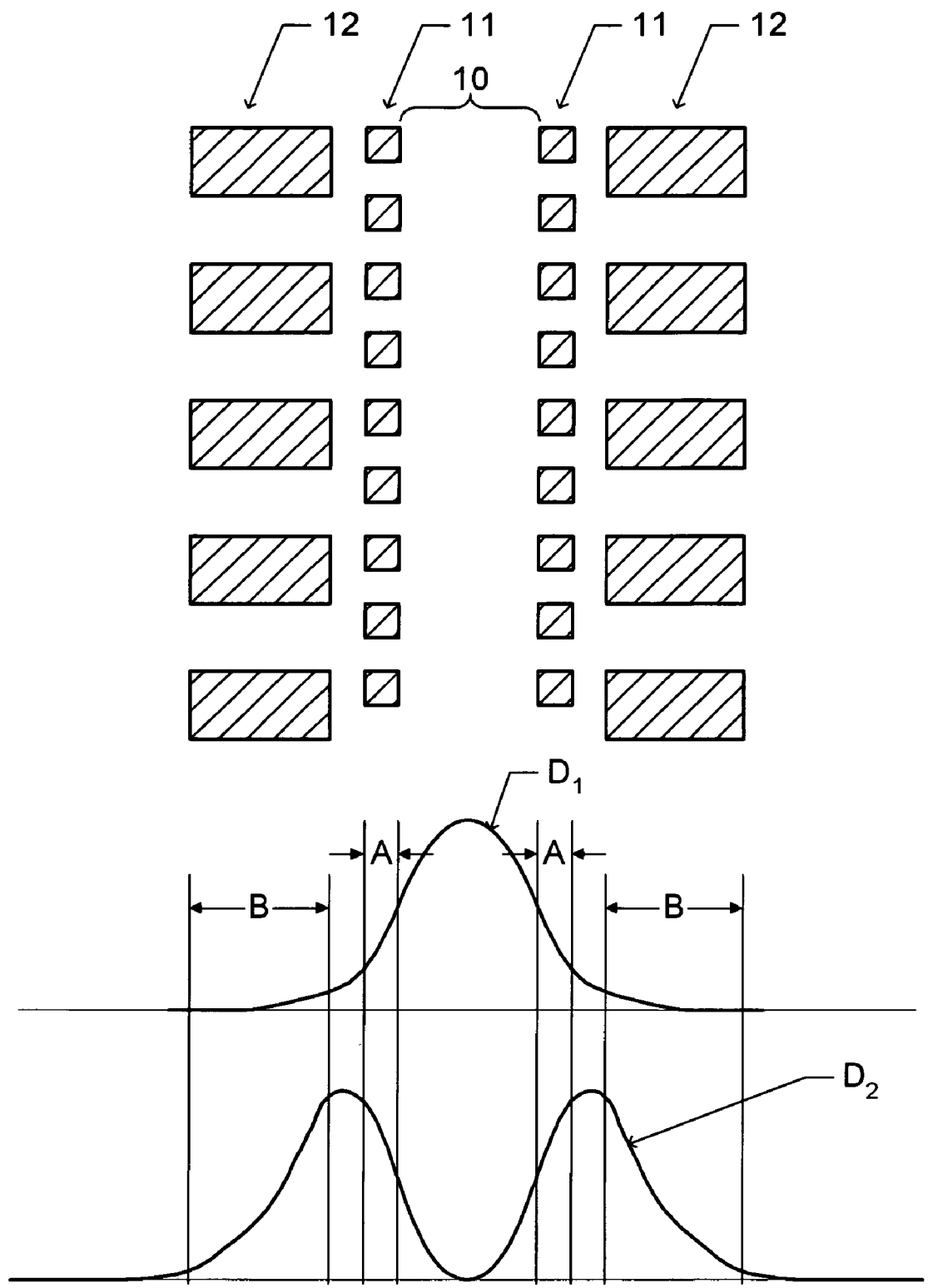
FIG. 2 is a diagram showing the positional relation between main and subsidiary diffraction gratings of the previously proposed ridge type laser device and light intensity distributions of the fundamental and second-order transverse modes.

FIG. 2 shows an example of the positional relation between the main and subsidiary diffraction gratings 11 and 12 of the previously proposed ridge type laser device and light intensity distributions of guided wave in a transverse direction. The main diffraction grating 11 is disposed on both sides of the ridge 10, the main diffraction grating 11 having a periodical structure that a high refractive index region (convex portion) and a low refractive index region (concave portion) are disposed alternately. The subsidiary diffraction grating 12 is disposed on outer sides of the main diffraction gratings 11, the subsidiary diffraction grating 12 having a periodical structure that a high refractive index region (convex portion) and a low refractive index region (concave portion) are disposed alternately.

A light intensity distribution of a guided wave of the fundamental transverse mode is indicated by a solid line $D_1$, and a light intensity distribution of the second-order transverse mode is indicated by a solid line $D_2$. The light intensity distribution $D_1$ of the fundamental transverse mode has a maximum intensity at the center of the ridge 10 in a width direction and the light intensity lowers as the distance from the center. The light intensity distribution $D_2$ of the second-order transverse mode has a minimum intensity at the center of the ridge 10 in a width direction and maximum intensities near the side planes of the ridge 10.

The second-order transverse mode has a relatively high light intensity in both of the areas A where the main diffraction gratings 11 are disposed and the areas B where the subsidiary diffraction gratings 12 are disposed. However, a light intensity of the fundamental transverse mode in the areas B where the subsidiary diffraction gratings 12 are disposed is considerably lower than that of the fundamental transverse mode in the areas A where the main diffraction gratings 11 are disposed.

Therefore, a coupling coefficient between the fundamental transverse mode and subsidiary diffraction gratings 12 is smaller than that between the fundamental transverse mode and main diffraction gratings 11. In contrast, the second-order transverse mode strongly couples with both of the main and subsidiary diffraction gratings 11 and 12. The following inequality exists:

$$(k11-k12) > (k21-k22)$$

where k11 is a coupling coefficient between the fundamental transverse mode and main diffraction gratings 11, k12 is a coupling coefficient between the fundamental transverse mode and subsidiary diffraction gratings 12, k21 is a coupling coefficient between the second-order transverse mode and main diffraction gratings 11, and k22 is a coupling coefficient between the second-order transverse mode and subsidiary diffraction gratings 12.

Namely, the fundamental transverse mode is strongly influenced by the main diffraction gratings 11, and rarely influenced by the subsidiary diffraction gratings 12. The second-order transverse mode is strongly influenced by the main diffraction gratings 11, and also strongly influenced by the subsidiary diffraction gratings 12.

Next, with reference to FIG. 3, description will be made on the influence of the subsidiary diffraction gratings 12 upon a guide wave having a wavelength selected by the main diffraction gratings 11.

Figure 3:
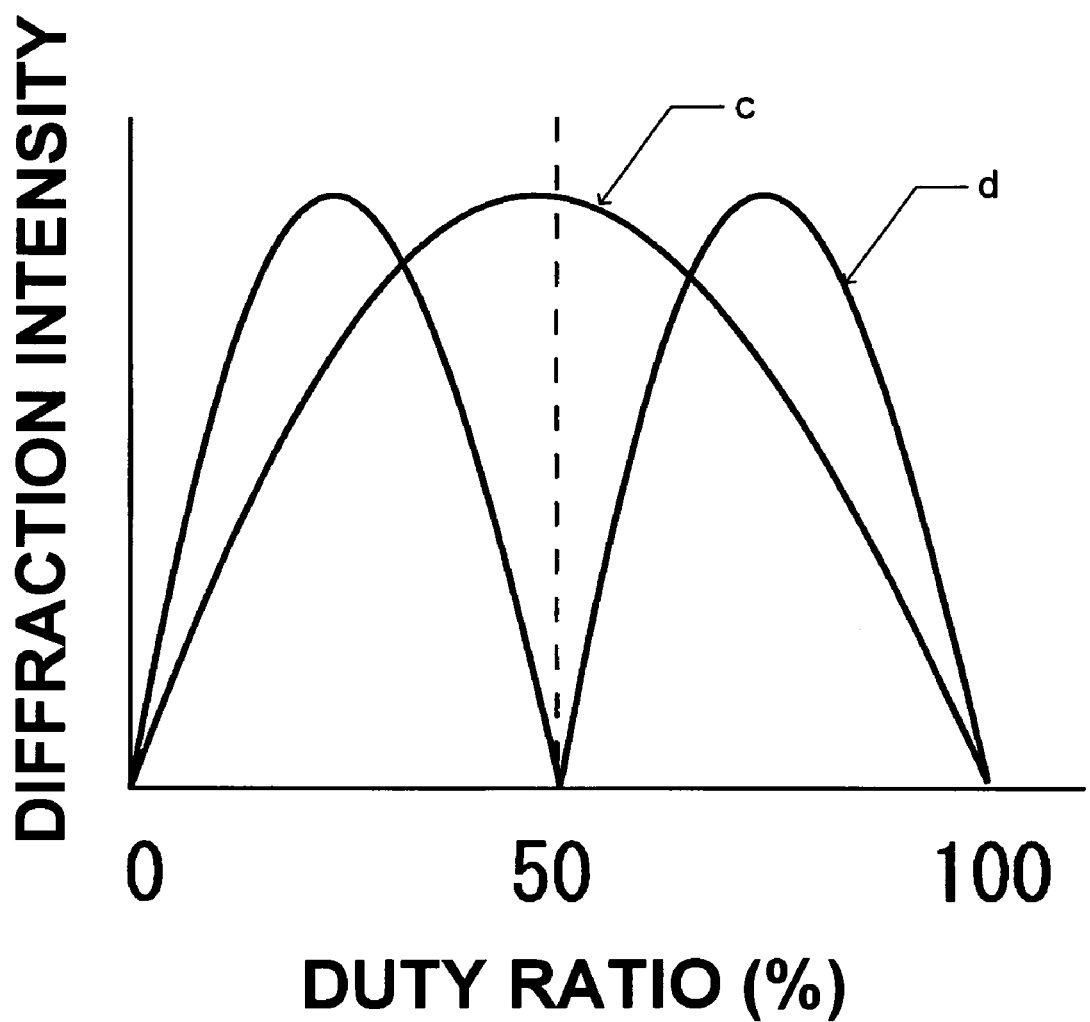
FIG. 3 is a graph showing the relation between a duty ratio of a diffraction grating and a diffraction intensity, wherein a curve c indicates a diffraction intensity in a direction perpendicular to a guided wave propagation direction, and a curve d indicates a diffraction intensity in the guided wave propagation direction.

FIG. 3 shows a relation between a geometrical shape of the subsidiary diffraction grating 12 and a diffraction intensity. The abscissa of FIG. 3 represents a duty ratio in the unit of "%". The duty ratio means a ratio of the convex portion in one period to one period of the subsidiary diffraction grating 12. The ordinate represents a diffraction intensity in an arbitrary unui. A curve c indicates a diffraction intensity in a direction perpendicular to a substrate surface, and a curve d indicates a diffraction intensity in the propagation direction of a guided wave.

At a duty ratio of 50%, a diffraction intensity in the substrate normal direction is maximum. As the duty ratio departs from 50%, the diffraction intensity in the normal direction becomes weak, and takes zero at duty ratios of 0% and 100%. At duty ratios of 25% and 75%, a diffraction intensity in the guided wave propagation direction becomes maximum. As the duty ratio departs from 25% and 75%, the diffraction intensity becomes weak, and takes zero at duty ratios of 0%, 50% and 100%.

Therefore, near at a duty ratio of 50% of the subsidiary diffraction gratings 12, a propagation loss of guided wave becomes large. However, since the fundamental transverse mode is rarely influenced by the subsidiary diffraction gratings 12, a propagation loss of the fundamental transverse mode does not increase. In contrast, the second-order transverse mode is influenced greatly by the subsidiary diffraction gratings 12, and diffracted in the direction perpendicular to the waveguide so that a propagation loss becomes large.

A "recoupling intensity of the second-order transverse mode by the subsidiary diffraction gratings" is defined as an intensity by which a guided wave of the second-order transverse mode propagating along the optical waveguide by coupling the main diffraction gratings 11 is recoupled with the optical waveguide by being diffracted by the subsidiary diffraction gratings 12. A "recoupling intensity of the fundamental transverse mode by the subsidiary diffraction gratings" is defined as an intensity by which a guided wave of the fundamental transverse mode is recoupled with the optical waveguide by being diffracted by the subsidiary diffraction gratings 12. In the first embodiment, a recoupling intensity of the second-order transverse mode by the subsidiary diffraction gratings is weaker than that of the fundamental transverse mode by the subsidiary diffraction gratings. Oscillation of the second-order transverse mode can therefore be suppressed.

In order to obtain sufficiently the effects of suppressing oscillation of the second-order transverse mode, a duty ratio of the subsidiary diffraction gratings 12 is preferably set within a range between 35% and 65%. Although the period of the subsidiary diffraction gratings 12 is set to a twofold of that of the main diffraction gratings 11, when the period of the subsidiary diffraction gratings 12 is at least 1.2 times as long as that of the main diffraction gratings 11, oscillation of the second-order transverse mode can be suppressed sufficiently, because the guided wave is diffracted in such a manner that diffracted light is not recoupled with the waveguide.

The previous proposal has been described through comparison between the fundamental and second-order transverse modes. High-order transverse modes higher than the second-order transverse mode also couple the subsidiary diffraction gratings 12 stronger than the fundamental transverse mode. Therefore, the ridge type laser device previously proposed can suppress oscillation of high-order transverse modes higher than the second-order transverse mode. For example, an oscillation threshold value of high-order transverse modes of the previously proposed ridge type laser device can be set to about 4 to 10 times as large as that of a conventional laser device. In this case, a rise in an oscillation threshold value of the fundamental transverse mode can be suppressed to about several %. In the embodiments to be described hereunder, the effects of suppressing a rise in an oscillation threshold value of the fundamental transverse mode can be enhanced further.

Figure 4:
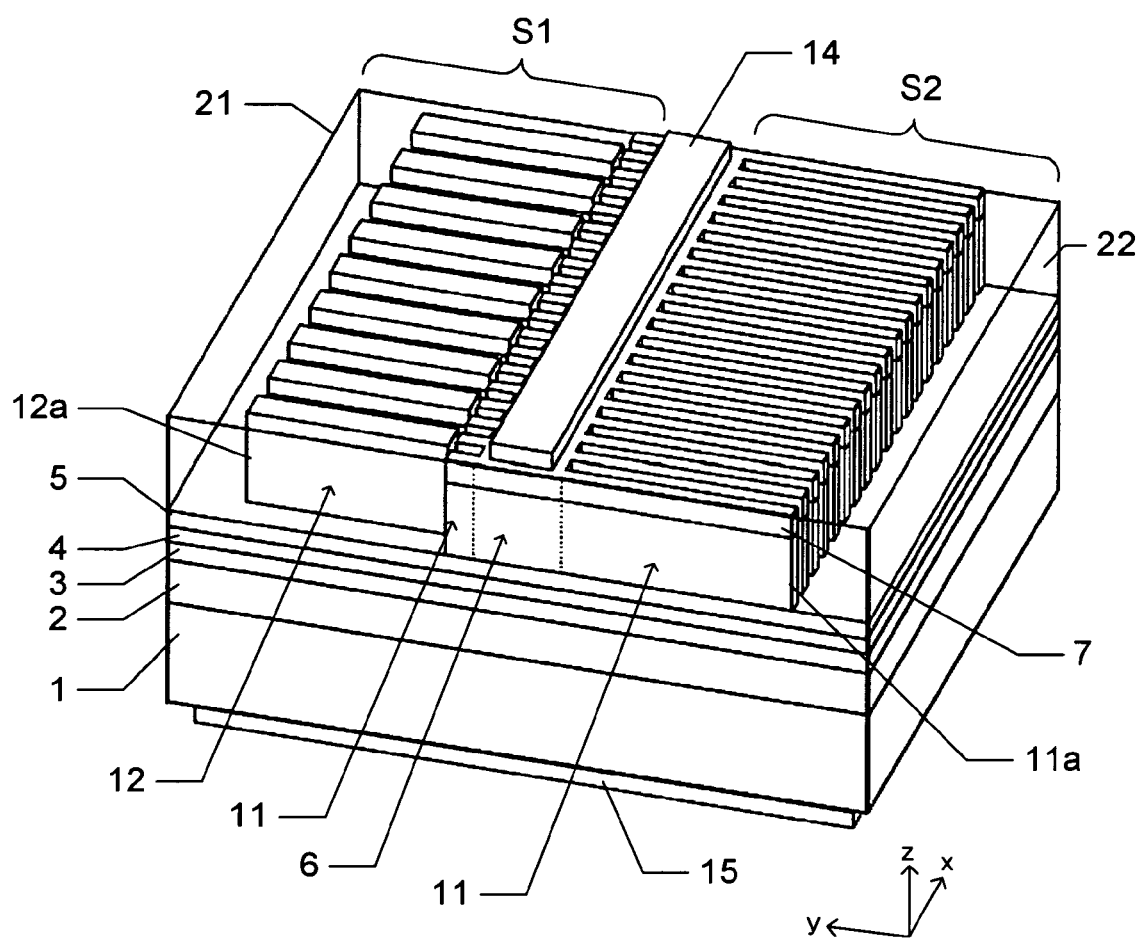
FIG. 4 is a perspective view of a ridge type laser device according to a first embodiment.

FIG. 4 is a perspective view of a ridge type laser device of the first embodiment. A lower cladding layer 2 made of p-type $Al_{0.35}Ga_{0.65}As$ and having a thickness of 2 µm, a lower optical guide layer 3 made of p-type $Al_{0.15}Ga_{0.85}As$ and having a thickness of 50 nm, an active layer 4, and an upper optical guide layer 5 made of n-type $Al_{0.15}Ga_{0.85}As$ and having a thickness of 50 nm are sequentially stacked in this order on the principal surface of a substrate 1 made of p-type GaAs. The active layer 4 has a lamination structure that a structure of an InGaAs layer having a number of quantum dots of InAs sandwiched between GaAs layers is repeated ten times in a thickness direction.

On the upper optical guide layer 5, a ridge-shaped cladding layer 6 is formed which is made of n-type $Al_{0.35}Ga_{0.65}As$ and having a thickness (height) of 1 µm and a width of 2 µm. The ridge-shaped cladding layer 6 is disposed along a straight line parallel to the substrate surface. An xyz orthogonal coordinate system is defined which has the principal surface of the substrate 1 as an xy plane, the direction along which the ridge-shaped cladding layer 6 extends as an x-axis, and the normal direction of the principal surface of the substrate 1 as a z-axis.

Main diffraction gratings 11 having periodicity in the x-direction are formed on the surface of the upper optical guide layer 5 on both sides of the ridge-shaped cladding layer 6. The main diffraction gratings 11 are constituted of a number of first members 11a protruding from each of both sidewalls of the ridge-shaped cladding layer 6 in the y-direction. A height of each first member 11a is the same as that of the ridge-shaped cladding layer 6, and a size (thickness) in the x-direction is 99 nm. Each if intervals between adjacent two first members 11a is set to 99 nm. Namely, a period of the main diffraction gratings 11 is 198 nm. The first member 11a disposed on one side (first side S1) of the ridge-shaped cladding layer 6 has a protrusion amount of 500 nm from the sidewall of the ridge-shaped cladding layer 6, and the first member 11a disposed on the other side (second side S2) has a protrusion amount of 10 µm.

A subsidiary diffraction grating 12 is disposed on the surface of the upper optical guide layer 5 on the first side S1 of the ridge-shaped cladding layer 6. The subsidiary diffraction grating 12 is constituted of a number of second members 12a disposed in the x-direction. A height of each second member 12a is the same as that of the ridge-shaped cladding layer 6, and a size (thickness) in the x-direction is 198 nm. Each of intervals between adjacent two second members 12a is set 198 nm. Namely, a period of the subsidiary diffraction grating 12 is 396 nm. A size of the second member 12a in the y-direction is, for example, 9.5 µm. The subsidiary diffraction grating 12 is disposed in contact with the main diffraction grating 11 disposed on the first side S1, or with a fine clearance from the main diffraction grating 11 in the y-direction.

A contact layer 7 made of Si-doped n-type GaAs and having a thickness of 0.4 µm is disposed on the ridge-shaped cladding layer 6, main diffraction gratings 11 and subsidiary diffraction grating 12. The contact layer 7 has the same plan shape as that of the ridge-shaped cladding layer 6, main diffraction gratings 11 and subsidiary diffraction grating 12.

Space regions of the main diffraction grating 11 disposed on the first side S1 of the ridge-shaped cladding layer 6 and space regions of the subsidiary diffraction grating 12 are filled with a first burying member 21. The first burying member 21 also covers the surface of the upper optical guide layer 5 outside the subsidiary diffraction grating 12. Space regions of the main diffraction grating 11 disposed on the second side S2 of the ridge-shaped cladding layer 6 are filled with a second burying member 22. The second burying member 22 also covers the surface of the upper optical guide layer 5 outside the main diffraction grating 11.

The level of an upper surface of the first and second burying members 21 and 22 may be approximately the same as that of an upper surface of the contact layer 7, or the first and second burying members 21 and 22 may cover the upper surface of the contact layer 7.

A refractive index of the first burying member 21 is higher than that of the second burying member 22. For example, the first burying member 21 is made of $TiO_2$ and the second burying member 22 is made of $SiO_2$. Refractive indices of $TiO_2$ and $SiO_2$ are 2.3 and 1.5, respectively. A refractive index of $Al_{0.35}Ga_{0.65}As$ as the material of the main diffraction gratings 11 and subsidiary diffraction grating 12 is about 3.23.

An upper electrode 14 is formed on the contact layer 7 covering the ridge-shaped clad layer 6, and a lower electrode 15 is formed on the bottom of the substrate 1. The upper and lower electrodes 14 and 15 have a two-layer structure of an AuZn layer and an Au layer, and are in ohmic contact with the contact layer 7 and substrate 1, respectively.

Figure 5:
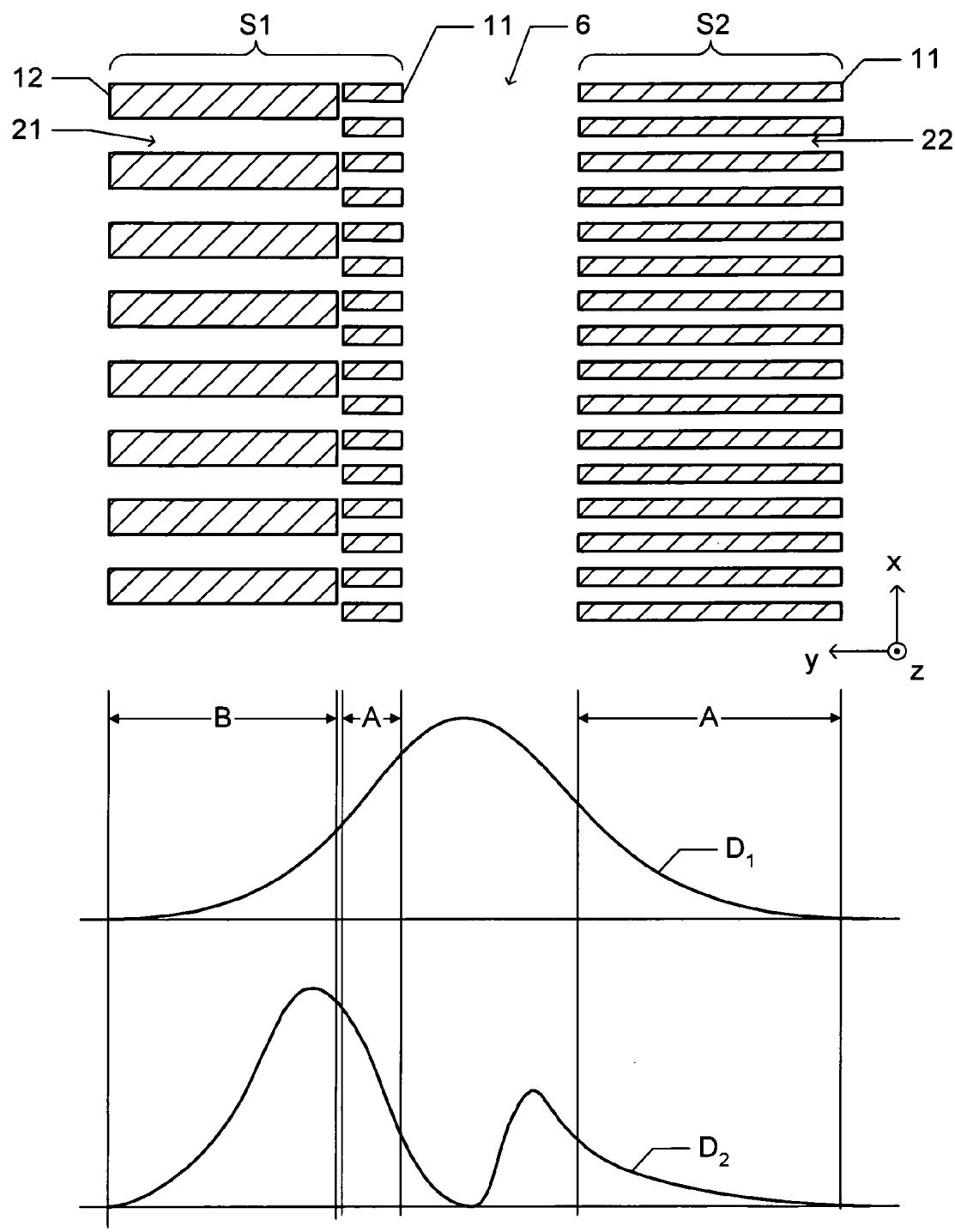
FIG. 5 is a diagram showing the positional relation between main and subsidiary diffraction gratings of the ridge type laser device of the first embodiment and light intensity distributions of the fundamental and second-order transverse modes.

FIG. 5 shows a positional relation between a plan layout of the ridge-shaped cladding layer 6, main diffraction gratings 11 and subsidiary diffraction grating 12, and light intensity distributions of the fundamental and second-order transverse modes of the guided wave. A refractive index of the ridge-shaped cladding layer 6 is about 3.23. Refractive indices of the first and second members 11a and 12a constituting the main and subsidiary diffraction gratings 11 and 12 are also about 3.23. Since a refractive index of the first burying member 21 disposed on the first side S1 is 2.3, an average refractive index of the components disposed on the first side S1 is about 2.77. Since a refractive index of the second burying member 22 disposed on the second side S2 of the ridge-shaped cladding layer 6 is about 1.5, an average refractive index of the components disposed on the second side S2 of the ridge-shaped cladding layer 6 is about 2.37.

A refractive index distribution in the y-direction shows that the refractive index of the ridge-shaped cladding layer 6 is higher than the average refractive indices of the components disposed on both sides of the ridge-shaped cladding layer 6. A refractive index distribution along the z-direction shows that a refractive index is maximum at the position of the active layer 4. Therefore, the active layer 4 serves as a waveguide layer which defines an optical waveguide for guiding waves in the x-direction down below the ridge-shaped cladding layer 6.

Light intensity distributions $D_1$ and $D_2$ of the fundamental and second-order transverse modes expand to the area where the main and subsidiary diffraction gratings 11 and 12 are disposed. An average refractive index of the components on the first side S1 of the ridge-shaped cladding layer 6 is higher than that of the components on the second side S2. Therefore, the effective refractive index on the first side S1 affecting the guided wave is higher than that on the second side S2. Because of a difference between the effective refractive indices, the light intensity distribution of the transverse mode of the guided wave shifts towards the first side S1.

The light intensity distribution $D_1$ of the fundamental transverse mode is not bilateral symmetry, but shifts slightly from the center of the ridge-shaped cladding layer 6 towards the first side S1. The light intensity distribution $D_2$ has two peaks, and the peak on the first side S1 is higher than the peak on the second side S2.

The main diffraction gratings 11 are disposed adjacent to the ridge-shaped cladding layer 6. In this area A, the light intensity of the fundamental transverse mode is maintained high to some extent. Therefore, a guided wave of the fundamental transverse mode is coupled with the main diffraction gratings 11 relatively strongly. In contrast, since the subsidiary diffraction grating 12 is remote from the ridge-shaped cladding layer 6, in this area B a light intensity of the fundamental transverse mode lowers. Coupling between a guided wave of the fundamental transverse mode and the subsidiary diffraction grating 12 is therefore relatively weak. Component of the guided wave on the second side S2 is coupled with only the main diffraction grating 11 and is not coupled with the subsidiary diffraction grating 12. Since the light intensity distribution is shifted toward the first side S1, a light intensity of the fundamental transverse mode in the area B becomes large. However, component of the guided wave in this area B corresponds to the skirt portion of the light intensity distribution so that a degree of an increase in the light intensity is small. Therefore, as compared to the structure shown in FIGS. 1 and 2 in which the subsidiary diffraction grating 12 is disposed on both sides of the ridge-shaped cladding layer 6, a propagation loss of a guided wave of the fundamental transverse mode can be made small.

In contrast, since the light intensity distribution of the second-order transverse mode is biased toward the first side S1, coupling between the component constituting the peak on the first side S1 and the subsidiary diffraction grating 12 becomes strong. Since the component near the top of the peak on the first side S1 enters the area B, a coupling becomes strong significantly. Although the second transverse mode is not coupled with the subsidiary diffraction grating 12 on the second side S2, the second transverse mode is coupled strongly on the first side S1. Therefore, a coupling strength between a guided wave of the second-order transverse mode and the subsidiary diffraction grating 12 becomes stronger than that in the structure shown in FIGS. 1 and 2. Oscillation of the second-order transverse mode can therefore be suppressed efficiently.

A guided wave of the high-order transverse mode equal to or higher than third-order can maintain a sufficient coupling strength with the subsidiary diffraction grating 12 as well as the second-order transverse mode. Oscillation of the high-order transverse mode equal to or higher than third-order can therefore be suppressed efficiently.

As described above, the ridge type laser device of the first embodiment is smaller in a propagation loss of a guided wave of the fundamental transverse mode than the laser device shown in FIGS. 1 and 2. Therefore, it is possible to suppress a rise in an oscillation threshold value to be caused by disposing the subsidiary diffraction grating 12. A conventional ridge type laser device not disposing the subsidiary diffraction grating was actually compared with the ridge type laser device of the first embodiment. The oscillation threshold value of the ridge type laser device of the first embodiment was generally equal to that of the conventional ridge type laser device, or amount of rise in the oscillation threshold value of the ridge type laser device of the first embodiment is less than or compatible to several mA.

In the first embodiment, a period of the subsidiary diffraction grating 12 is as long as that of the main diffraction grating 11. As in the case of the ridge-type laser device previously proposed, when the period of the subsidiary diffraction grating 12 is at least 1.2 times as long as that of the main diffraction grating 11, oscillation of the second-order transverse mode can be suppressed sufficiently. It is preferable to set a duty ratio of the subsidiary diffraction grating 12 within a range between 35% and 65%. In order to shift sufficiently the light intensity distribution of the transverse mode toward the first side S1, it is preferable that a refractive index of the first burying member 21 is at least 1.2 times as large as that of the second burying member 22.

Next, with reference to FIGS. 6A to 6E, description will be made on a manufacture method for a ridge type laser device of the first embodiment.

Figure 6A:
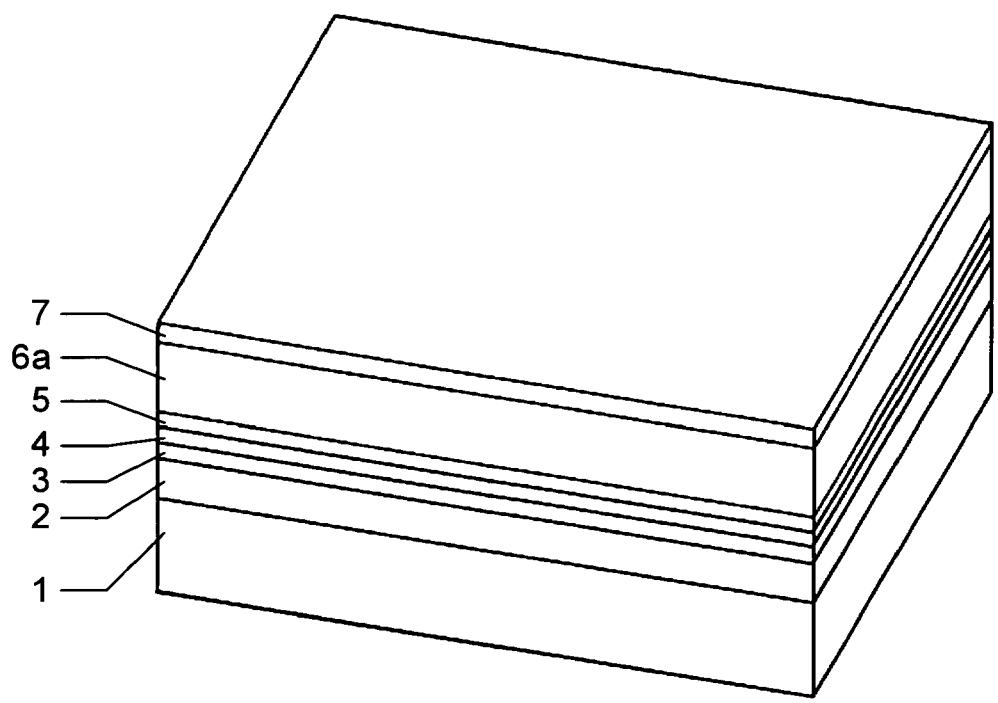
FIGS. 6A to 6E are perspective views of the ridge type laser device during manufacture for describing a method of manufacturing the device according to the first embodiment.

As shown in FIG. 6A, a lower cladding layer 2 made of p-type $Al_{0.35}Ga_{0.65}As$ and having a thickness of 2 µm, a lower optical guide layer 3 made of p-type $Al_{0.15}Ga_{0.85}As$ and having a thickness of 50 nm, a quantum dot active layer 4, and an upper optical guide layer 5 made of n-type $Al_{0.15}Ga_{0.85}As$ and having a thickness of 50 nm are formed on the principal surface of a substrate 1 made of p-type GaAs, for example, by molecular beam epitaxy (MBE). An upper cladding layer 6a made of n-type $Al_{0.35}Ga_{0.65}As$ and having a thickness of 1 µm and a contact layer 7 made of n-type GaAs and having a thickness of 0.4 µm, constituting the ridge-shaped clad layer 6 and the like shown in FIG. 4, are formed on the upper optical guide layer 5, by MBE.

Figure 6B:
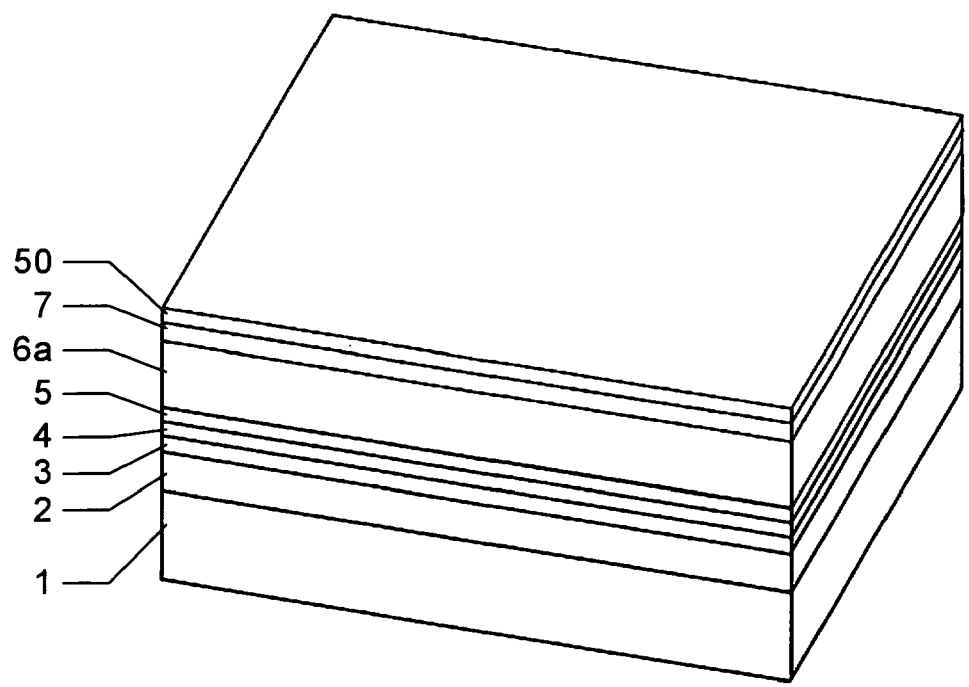

As shown in FIG. 6B, an electron beam exposure resist film 50 is formed on the contact layer 7.

Figure 6C:
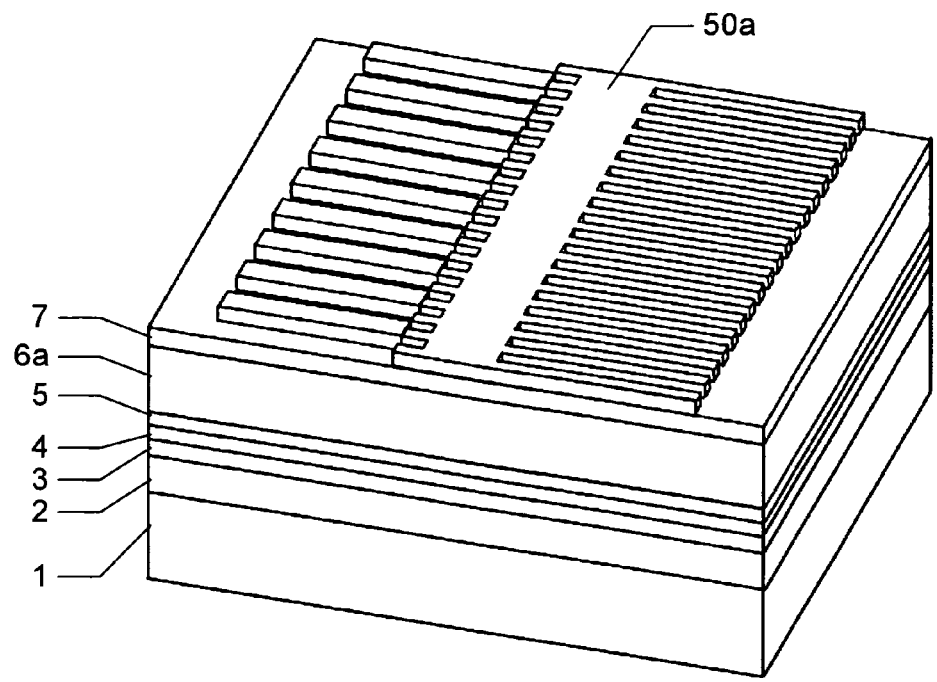

As shown in FIG. 6C, the resist film 50 is exposed and developed to form a resist pattern 50a. The resist film 50 is exposed, for example, using electron beam direct writing technology or the like. The resist pattern 50a has the same plan shape as that of the ridge-shaped clad layer 6, main diffraction gratings 11 and subsidiary diffraction grating 12 shown in FIG. 4.

Figure 6D:
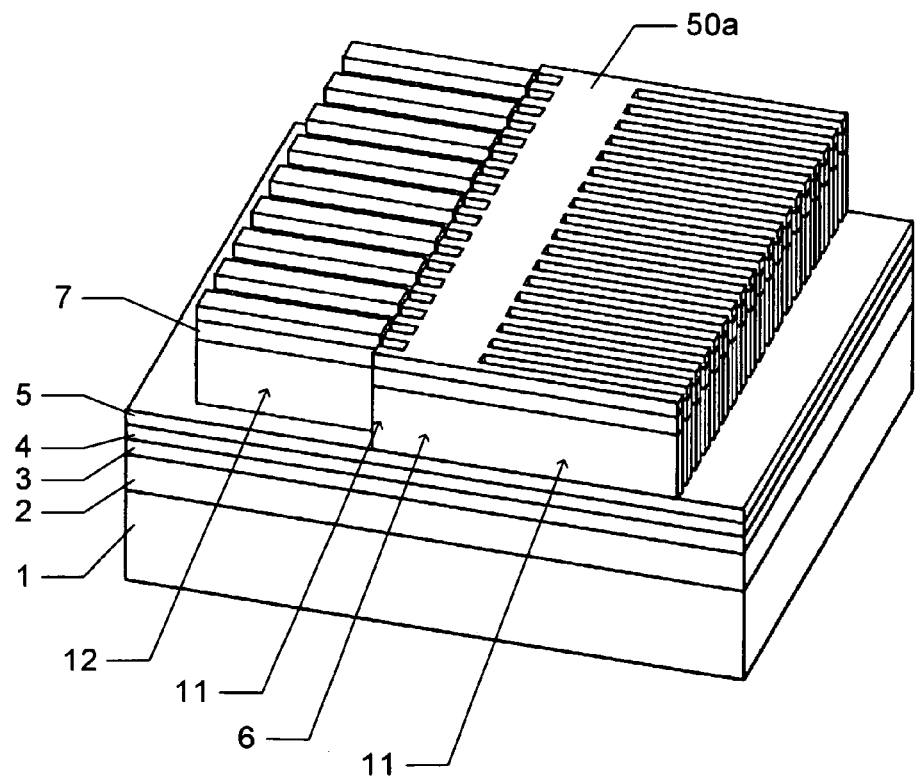

As shown in FIG. 6D, by using the resist pattern 50a as an etching mask, the contact layer 7 and upper cladding layer 6a are etched. This etching may be executed by dry etching using $Cl_2$ as etching gas. In this manner, a ridge-shaped cladding layer 6, main diffraction gratings 11 and subsidiary diffraction grating 12 made of n-type AlGaAs are formed, and a contact layer 7 of n-type GaAs remains thereon. After this etching, the resist pattern 50a is removed.

Figure 6E:
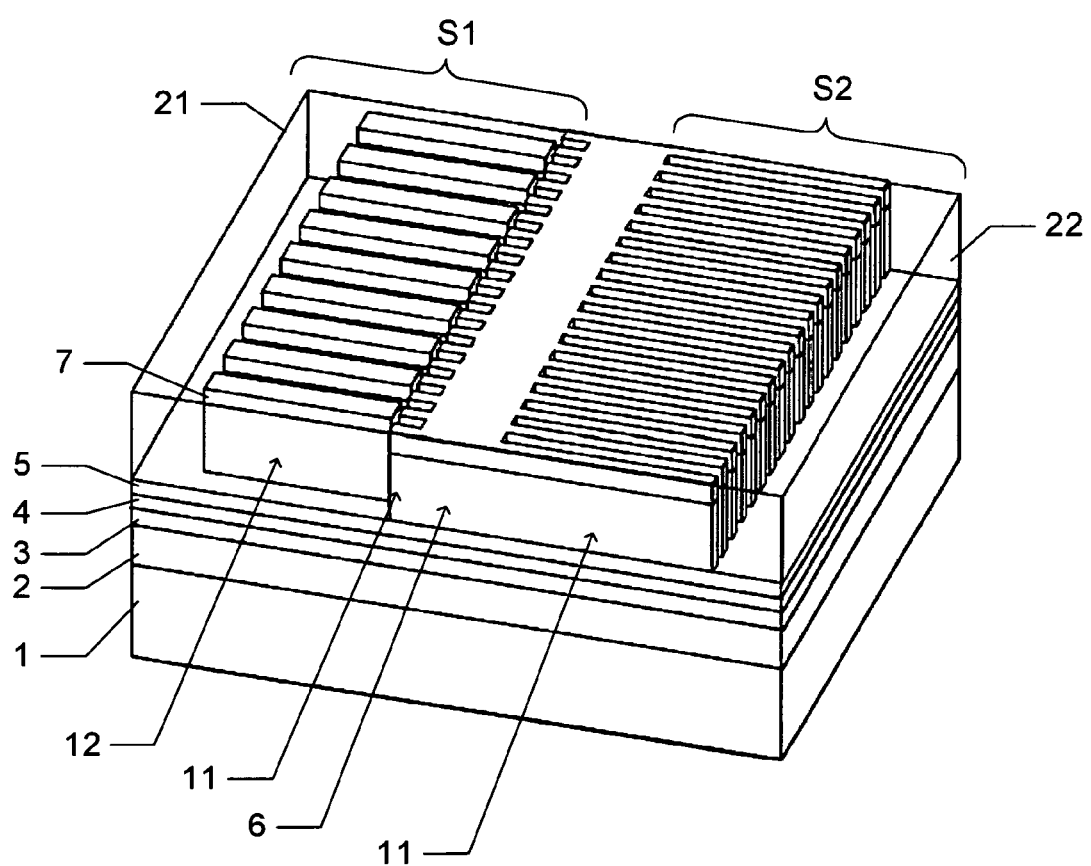

As shown in FIG. 6E, a first burying member 21 made of $TiO_2$ is deposited on the upper optical guide layer 5 on the first side S1 of the ridge-shaped cladding layer 6, and a second burying member 22 made of $SiO_2$ is deposited on the second side S2. Space regions of the main and subsidiary diffraction gratings 11 and 12 disposed on the first side S1 are filled with the first burying member 21, and space regions of the main diffraction grating 11 disposed on the second side S2 are filled with the second burying member 22. In the following, description will be made on the method of forming the first and second burying members 21 and 22.

First, a $TiO_2$ film is deposited on the whole surface of the upper optical guide layer 5 in such a manner that the space regions of the main and subsidiary diffraction gratings 11 and 12 are completely filled with the $TiO_2$ film. The $TiO_2$ film deposited on the first side S1 is covered with a resist pattern, and the $TiO_2$ film deposited on the second side S2 is removed. Thereafter, an $SiO_2$ film is deposited on the whole substrate surface in such a manner that the space regions of the main diffraction grating 11 disposed on the second side S2 are completely filled with the $SiO_2$ film. After covering the $SiO_2$ film deposited on the second side S2 with a resist pattern, the $SiO_2$ film deposited on the first side S1 is removed. In this manner, the first and second burying members 21 and 22 can be formed.

As shown in FIG. 4, an upper electrode 14 and a lower electrode 15 are formed. These electrodes are formed, for example, by vacuum evaporation. A plan shape of each electrode can be defined, for example, by lift-off method. After the upper and lower electrodes 14 and 15 are formed, the semiconductor substrate 1 is separated into unit elements by cleavage. After the substrate is separated into unit elements, a facet process is performed. For example, a front facet is subjected to non-reflection coating, and a back facet is subjected to high reflection coating. The cleavaged surface itself may be exposed on the back facet.

In the method described above, the resist pattern 50a shown in FIG. 6C is used as the etching mask. A hard mask such as $SiO_2$ may be used as the etching mask.

In the method described above, although the etching mask is formed by electron beam exposure, interference exposure may be used. Next, with reference to FIGS. 7A to 7H, description will be made on a method of forming an etching mask by using interference exposure.

Figure 7A:
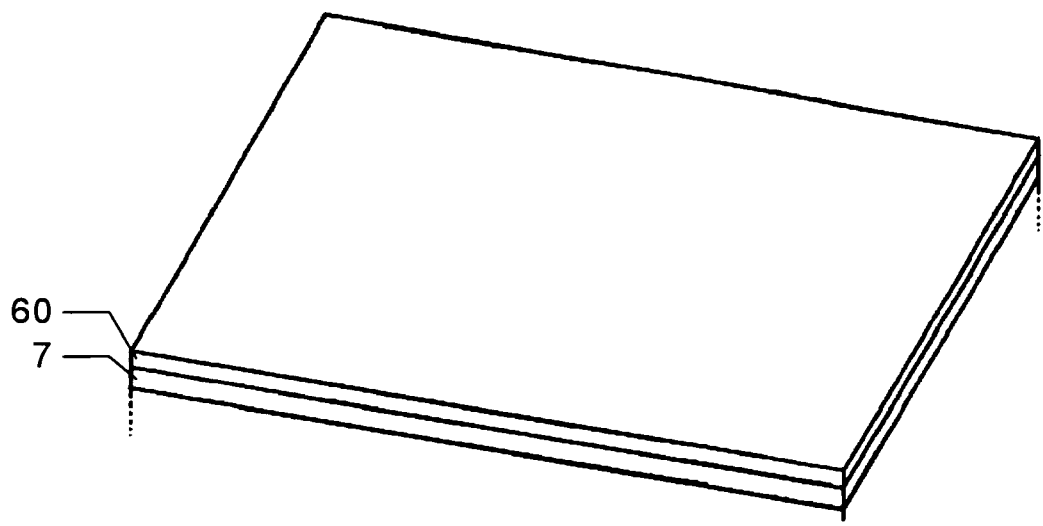
FIGS. 7A to 7H are perspective views of the ridge type laser device during manufacture for describing another method of manufacturing the device according to the first embodiment.

As shown in FIG. 7A, a resist film 60 is formed by coating positive type photoresist on the surface of the contact layer 7. The resist film 60 is exposed and developed two-beam interference exposure.

Figure 7B:
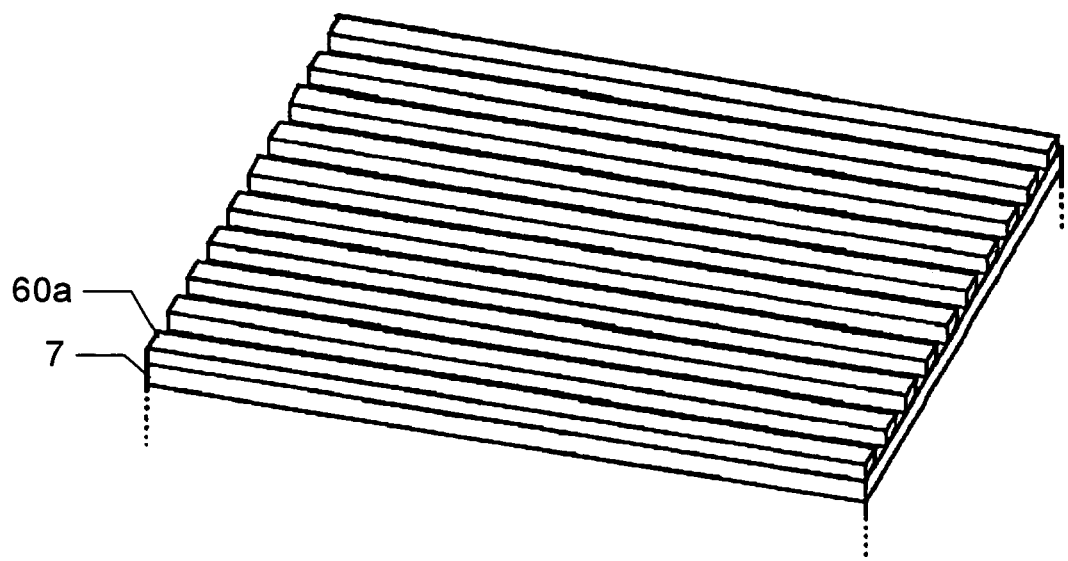

As shown in FIG. 7B, a first diffraction grating pattern 60a made of resist material is therefore formed. A period of the first diffraction grating pattern 60a is set to be the same as that of the main diffraction gratings 11.

Figure 7C:
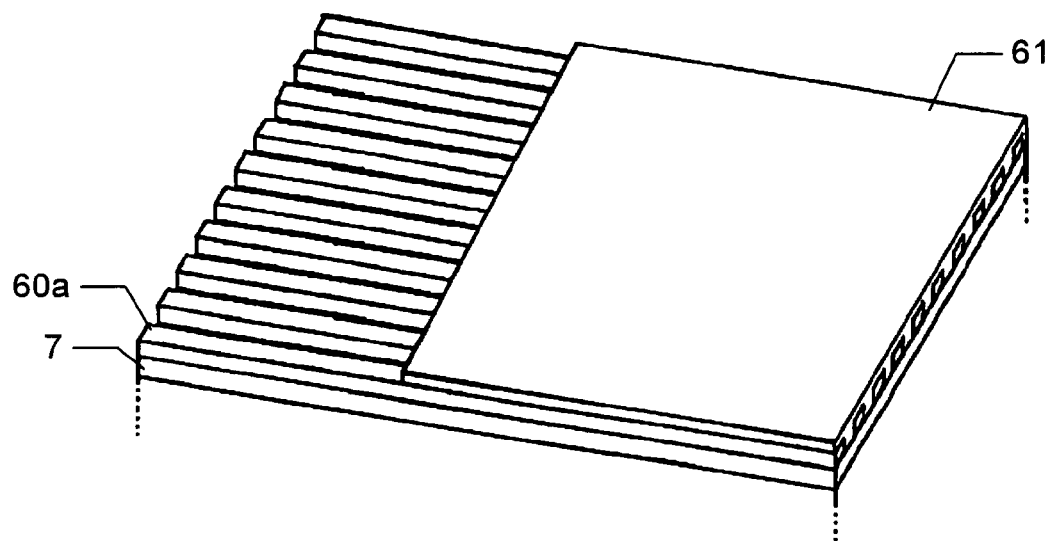

As shown in FIG. 7C, a region where the main diffraction gratings 11 and ridge-shaped cladding layer 6 are to be formed is covered with a mask film 61 made of SiN and having a thickness of 200 nm. Namely, the region on one side of a border line between the main diffraction grating 11 and subsidiary diffraction grating 12 shown in FIG. 4 is covered with the mask film 61, the one side being the one where the main diffraction gratings 11 are located. The mask film 61 can be formed by depositing an SiN film on the whole substrate surface and using usual photolithography and wet etching using buffered hydrofluoric acid.

Figure 7D:
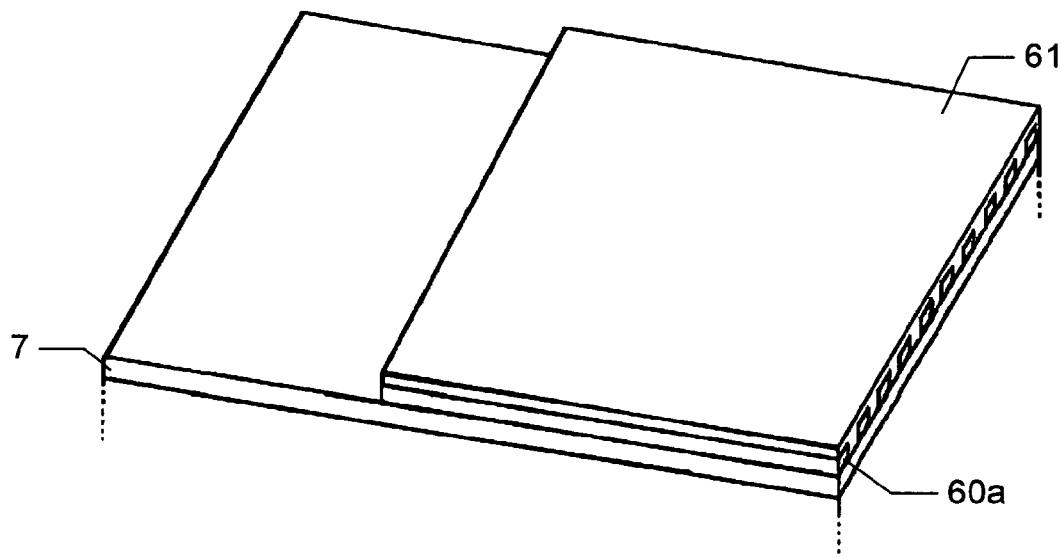

As shown in FIG. 7D, the first diffraction grating pattern 60a not covered with the mask film 61 is removed by reactive ion etching using oxygen gas.

Figure 7E:
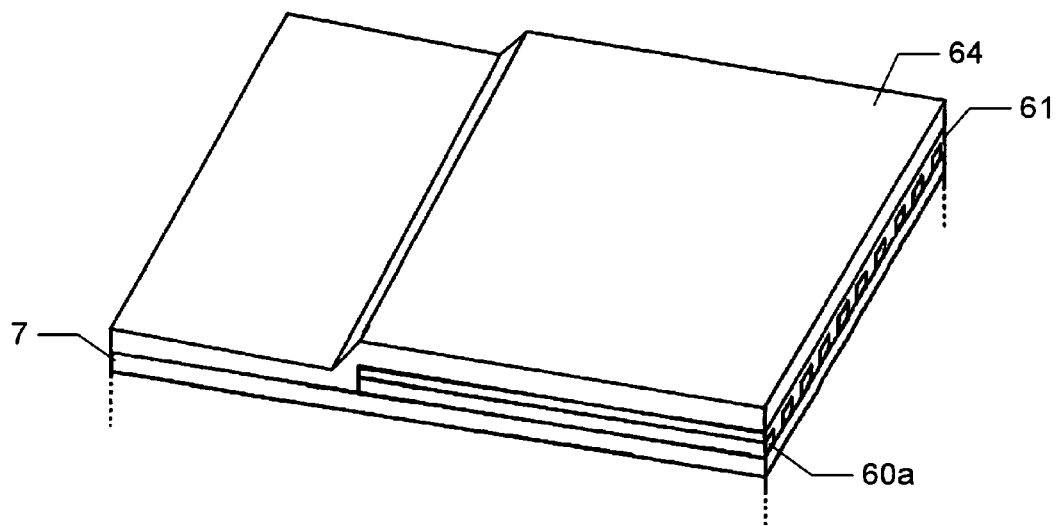

As shown in FIG. 7E, a resist film 64 is formed on the whole substrate surface by coating positive type photoresist material. The resist film 64 is exposed by two-beam interference exposure and then developed.

Figure 7F:
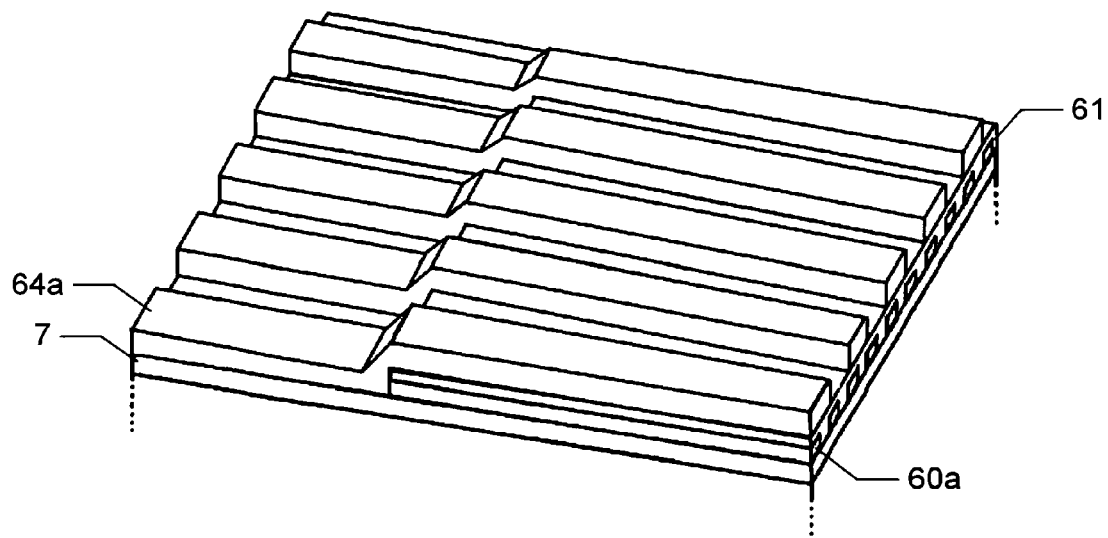

As shown in FIG. 7F, a second diffraction grating 64a made of resist material is therefore formed. The second diffraction grating 64a has the same period as that of the subsidiary diffraction grating 12. The mask film 61 is removed by wet etching using buffered hydrofluoric acid. In this case, a second diffraction grating pattern 64a formed on the mask film 61 is also removed.

Figure 7G:
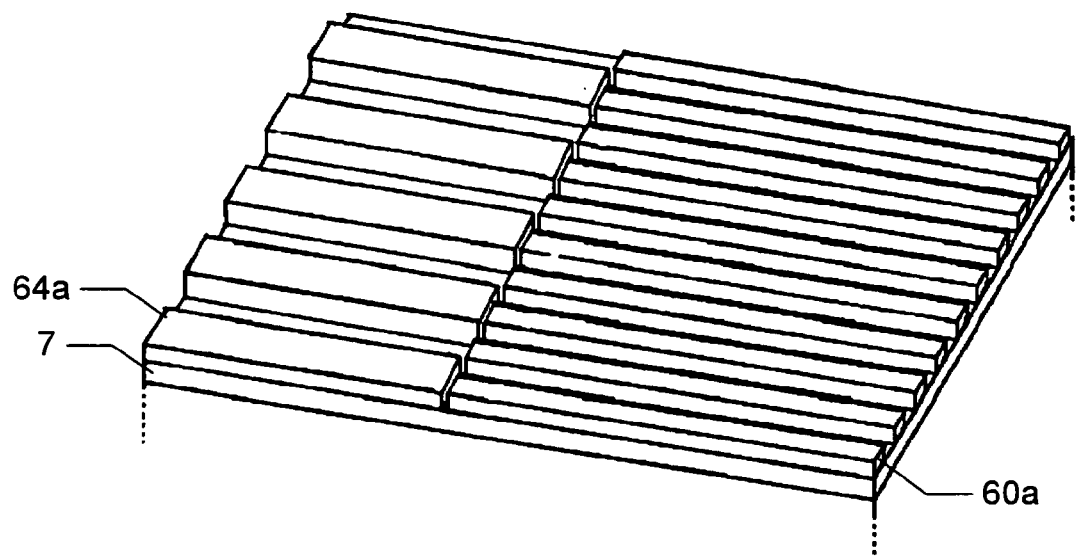

As shown in FIG. 7G, the first diffraction grating pattern 60a is therefore exposed in the region where the first diffraction gratings 11 and ridge-shaped cladding layer 6 are to be formed. The second diffraction pattern 64a remains in the region where the subsidiary diffraction grating 12 is to be formed.

Figure 7H:
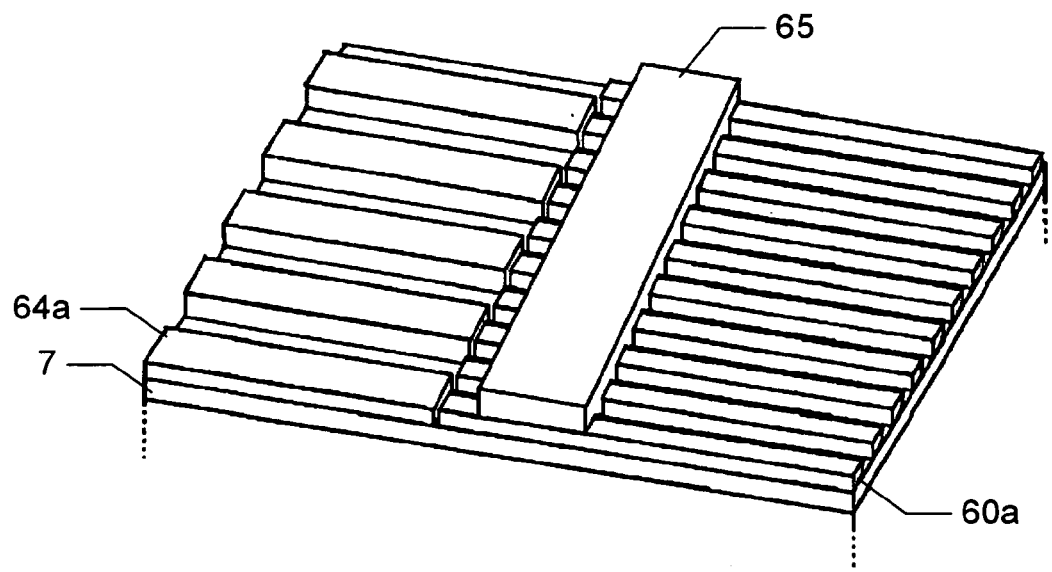

As shown in FIG. 7H, a ridge pattern 65 made of $SiO_2$ or SiN is formed. The ridge pattern 65 is disposed on one side the border line between the first and second diffraction grating patterns 60a and 64a, the one side being the one where the first diffraction grating pattern 60a is located. The ridge pattern 65 has a plan shape corresponding to the ridge-shaped cladding layer 6. The ridge pattern 65 can be formed by depositing an insulating film made of $SiO_2$ or SiN on the whole substrate surface, and by using usual photolithography and wet etching using buffered hydrofluoric acid. The first and second diffraction grating patterns 60a and 64a and ridge pattern 65 can be used as an etching mask, as in the case of the resist pattern 50a shown in FIG. 6C.

Figure 17:
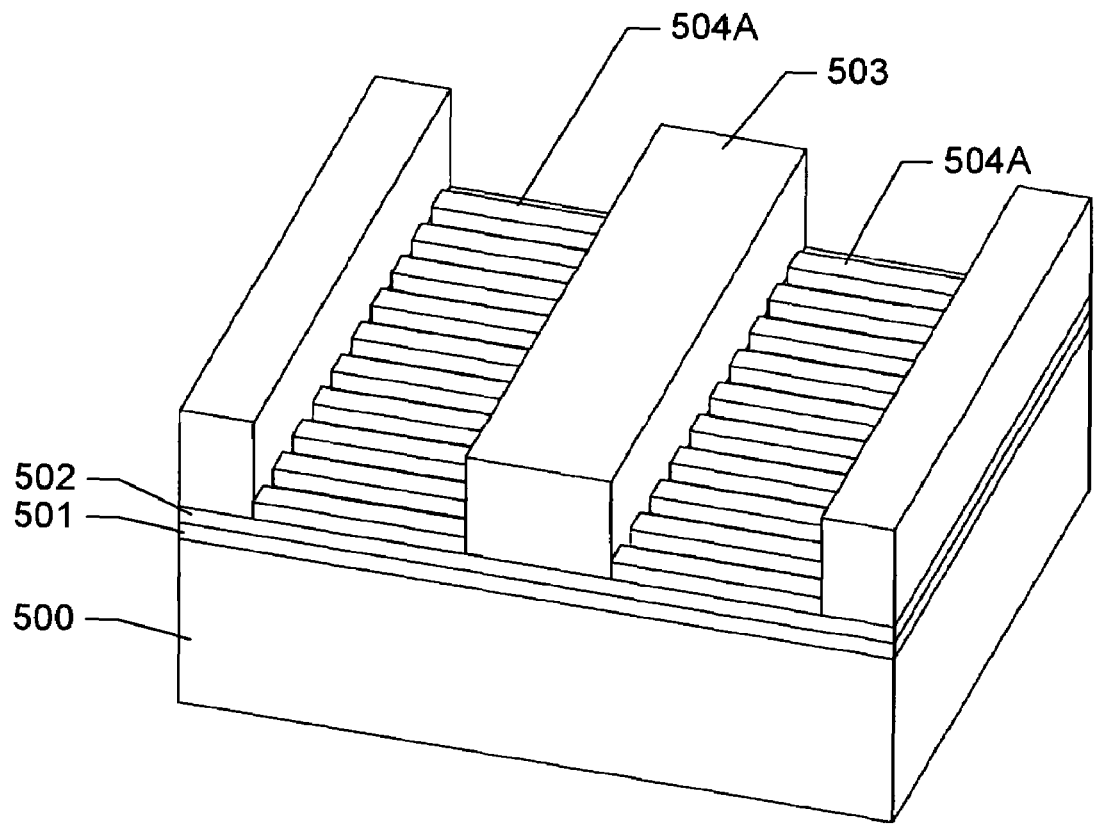
FIG. 17 is a perspective view of a conventional ridge type laser device.
Figure 18:
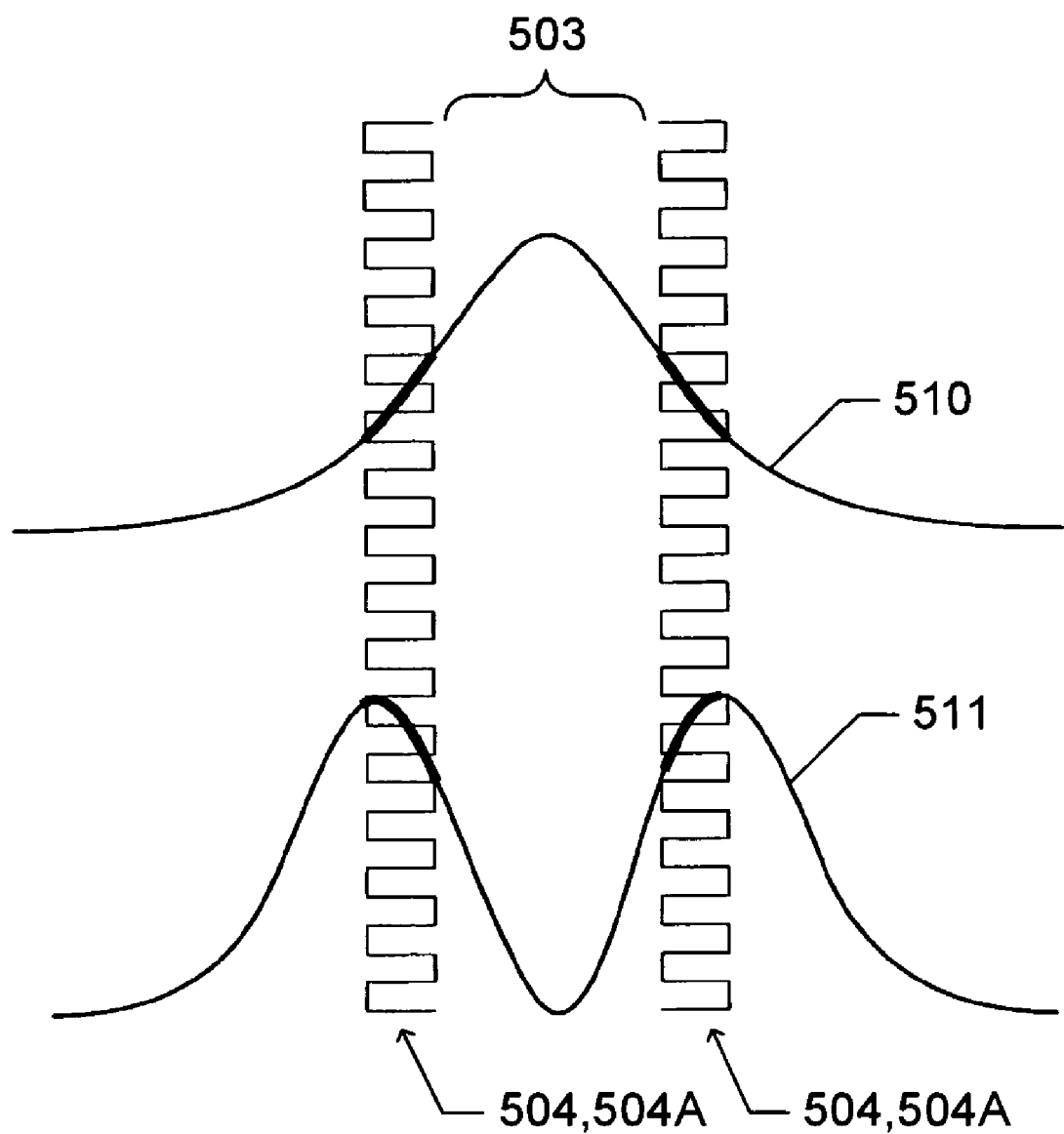
FIG. 18 is a diagram showing the positional relation between diffraction gratings of a conventional ridge type laser device and light intensity distributions of fundamental and second-order transverse mode of guided wave.
Figure 19:
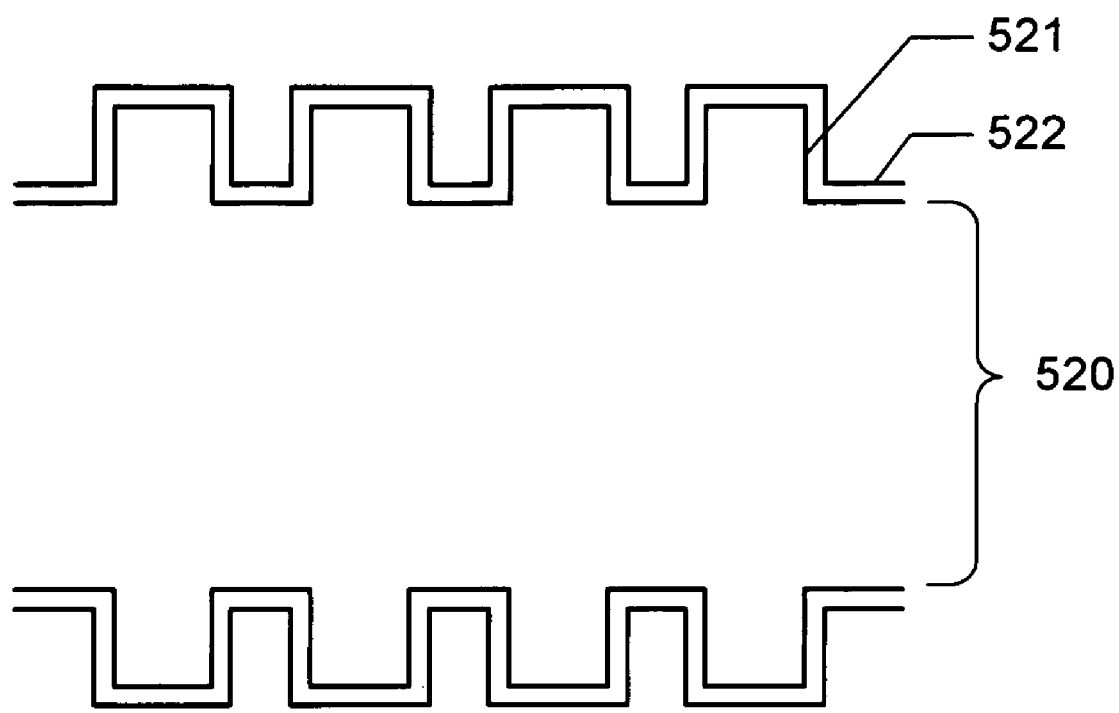
FIG. 19 is a plan cross sectional view of a ridge portion of a conventional ridge type laser device.

In FIGS. 7A to 7H, the ridge-shaped portions disposed outside the laser device diffraction gratings 504A shown in FIG. 17 and having the same height as that of the ridge 503 are not drawn. In actual, regions corresponding to the ridge-shaped portions on both sides of the laser device shown in FIG. 17 are retained on both sides of the device shown in FIGS. 7A to 7H.

Figure 8:
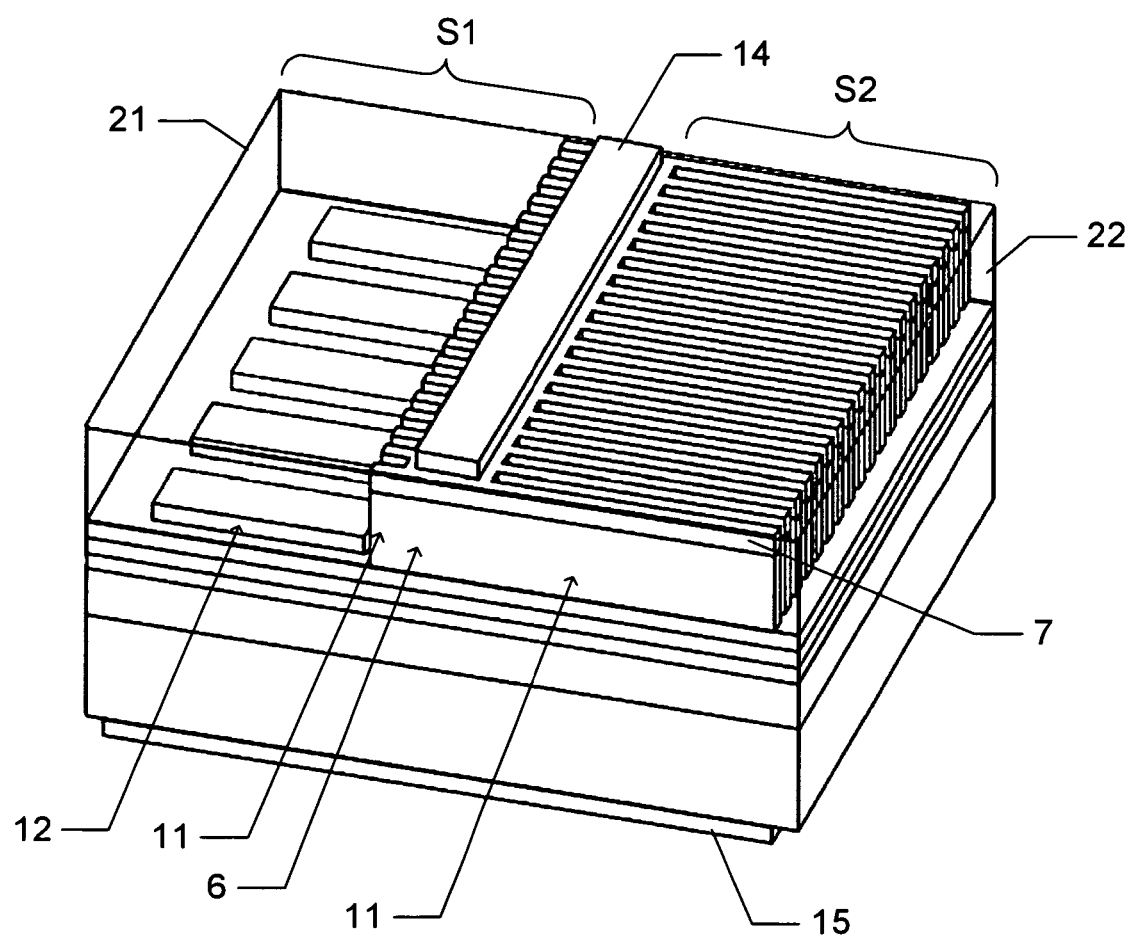
FIG. 8 is a perspective view of a ridge type laser device according to a second embodiment.

FIG. 8 is a perspective view of a ridge type laser device of the second embodiment. Description will be made by paying attention to different points from the ridge type laser device of the first embodiment. In the first embodiment, the subsidiary diffraction grating 12 has the same height as that of the ridge-shaped cladding layer 6 and main diffraction gratings 11. In the second embodiment, the subsidiary diffraction grating 12 has a height lower than that of the ridge-shaped cladding layer 6 and main diffraction gratings 11, the height of the subsidiary diffraction grating 12 being 100 nm for example. An upper surface of the first burying member 21 disposed on the first side S1 of the ridge-shaped cladding layer 6 is on the same level as an upper surface of the contact layer 7. Other structures are the same as those of the ridge type laser device of the first embodiment.

Paying attention to a region higher than the upper surface of the subsidiary diffraction grating 12, $TiO_2$ having a refractive index of 2.3 is disposed on the first side S1, and $SiO_2$ having a refractive index of 1.5 and AlGaAs having a refractive index of 3.23 are disposed on the second side S2. There is therefore no large difference between average refractive indices. However, paying attention to a region lower than the upper surface of the subsidiary diffraction grating 12, as in the case of the first embodiment, an average refractive index on the first side S1 is higher than that on the second side S2.

Guided wave propagating along the optical waveguide is confined in a region near the active layer 4 in respect of the thickness direction. Therefore, a refractive index of material disposed lower region than the upper surface of the subsidiary diffraction grating 12 greatly affects guided wave. As in the case of the first embodiment, also in the second embodiment, an effective refractive index on the first side S1 is therefore higher than that on the second side S2. Therefore, a light intensity distribution of transverse mode of guided wave is biased toward the first side S1. Therefore, the same effects as those of the first embodiment can be obtained.

A height of the main diffraction gratings 11 and a height of the subsidiary diffraction grating 12 may be reversed. Namely, the main diffraction gratings 11 is set lower than the ridge-shaped cladding layer 6, and a height of the subsidiary diffraction grating 12 is set equal to that of the ridge-shaped cladding layer 6. Both the main and subsidiary diffraction gratings 11 and 12 may be set lower than the ridge-shaped cladding layer 6.

Figure 9:
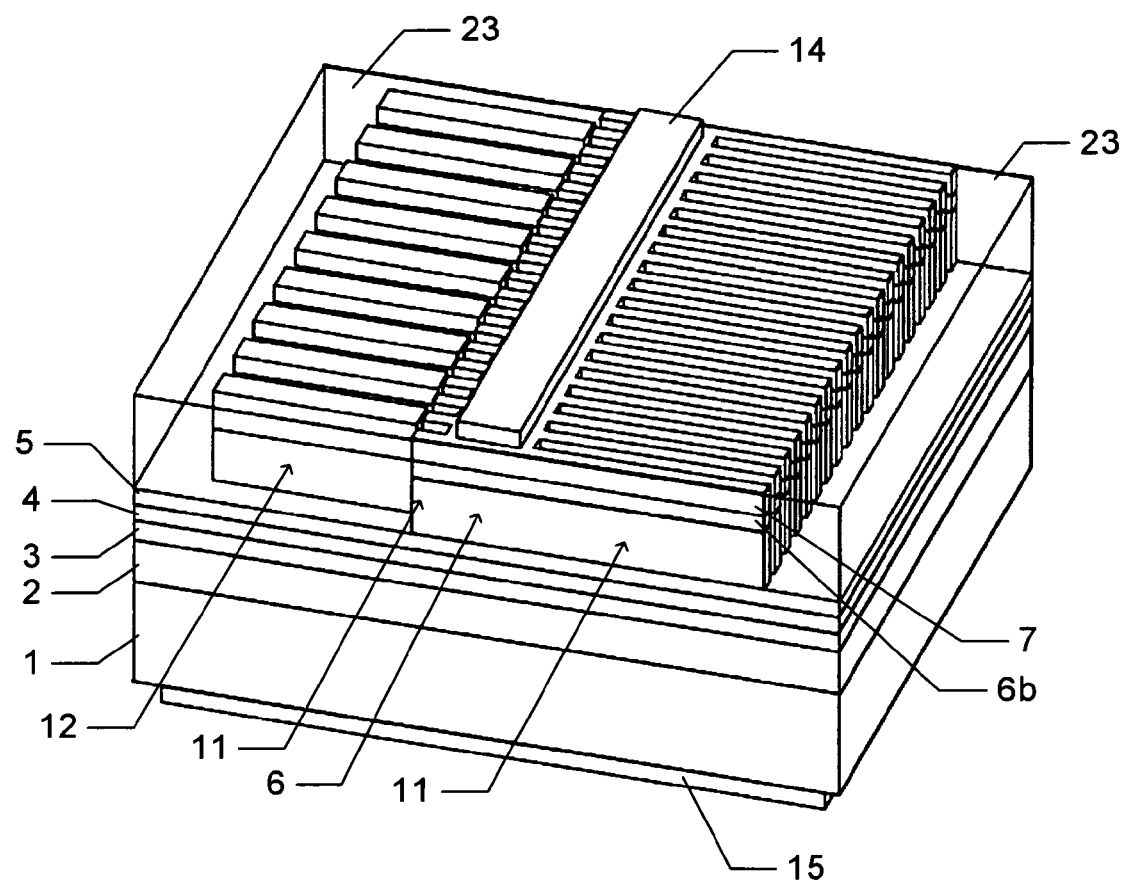
FIG. 9 is a perspective view of a ridge type laser device according to a third embodiment.

FIG. 9 is a perspective view of a ridge type laser device of the third embodiment. Description will be made by paying attention to different points from the ridge type laser device of the first embodiment shown in FIG. 4.

A semiconductor substrate 1 is made of n-type InP. In place of the lower cladding layer 2 of the first embodiment, a buffer layer 2 made of n-type InP and having a thickness of 500 nm is disposed. The semiconductor substrate 1 and buffer layer 2 serve as a lower cladding layer. A lower optical guide layer 3 on the buffer layer 2 is made of n-type GaInAsP. A transition wavelength of the lower optical guide layer 3 is 1050 nm, and a thickness thereof is 50 nm.

An active layer 4 is constituted of ten quantum well layers and eleven barrier layers, and has a multi quantum well structure that quantum well layers and barrier layers are alternatively laminated. The quantum well layer is made of GaInAsP, and has an emission wavelength of 1310 nm and a thickness of 6 nm. The barrier layer is made of n-type GaInAsP having a transition wavelength of 1050 nm, and has a thickness of 10 nm.

An upper optical guide layer 5 is made of p-type GaInAsP having a transition wavelength of 1050 nm, and has a thickness of 800 nm.

A ridge-shaped cladding layer 6 and main diffraction gratings 11 are made of p-type InP, and has a period of 200 nm and a height of 750 nm. A subsidiary diffraction grating 12 is made of the same material as that of the upper optical guide layer 5, and has a period of 400 nm and the same height as that of the ridge-shaped cladding layer 6. An upper cladding layer 6b made of the same material as that of the ridge-shaped cladding layer 6 is disposed between the main diffraction gratings 11 and contact layer 7 and between the subsidiary diffraction grating 12 and contact layer 7.

In place of the first and second burying members 21 and 22 of the first embodiment, a burying member 23 made of benzocyclobutene (BCB) is disposed.

In the first embodiment, effective refractive indices on the first side S1 and second side S2 of the ridge-shaped cladding layer 6 are made different by using different refractive indices of the first and second burying members 21 and 22. In contrast, in the third embodiment, different refractive indices are used for the materials of the main and subsidiary diffraction gratings 11 and 12, to obtain similar advantages.

Next, with reference to FIGS. 10A to 10G, description will be made on a manufacture method for the ridge type laser device of the third embodiment.

Figure 10A:
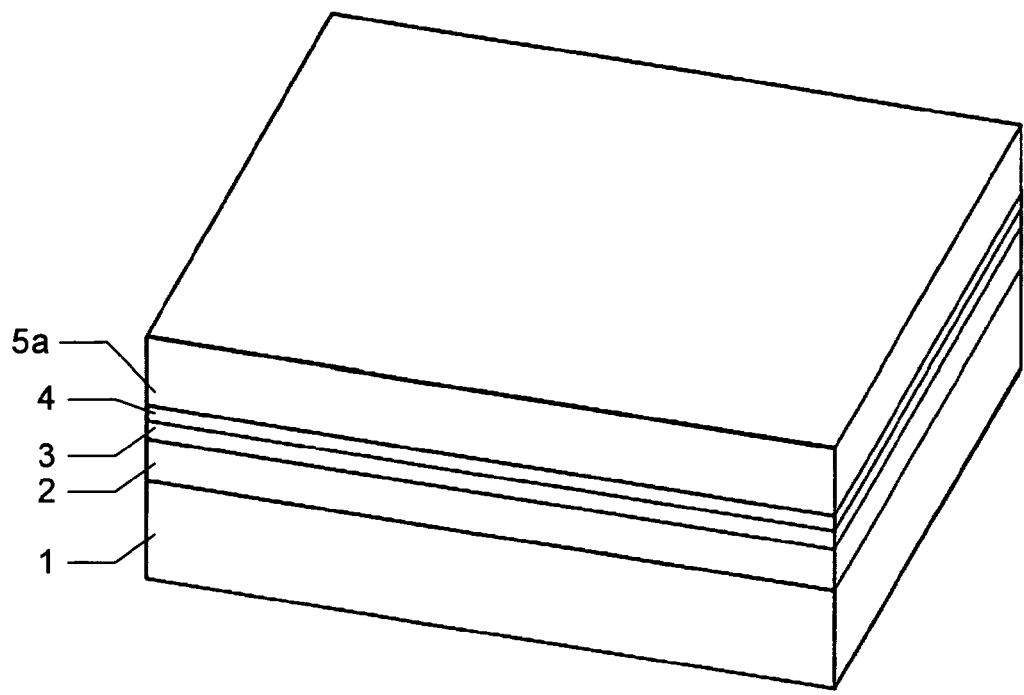
FIGS. 10A to 10G are perspective views of the ridge type laser device during manufacture for describing a method of manufacturing the device according to the third embodiment.

As shown in FIG. 10A, a buffer layer 2 made of n-type InP and having a thickness of 500 nm, a lower optical guide layer 3 made of n-type GaInAsP having a transition wavelength of 1050 nm and having a thickness of 50 nm, and a multi quantum well layer 4 are formed on the principal surface of a semiconductor substrate 1 made of n-type InP, by metal organic vapor phase epitaxy (MOVPE). A high refractive index layer 5a is formed on the multi quantum well layer 4, the high refractive index layer 5a being made of p-type GaInAsP having a transition wavelength of 1050 nm and having a thickness of 800 nm.

Figure 10B:
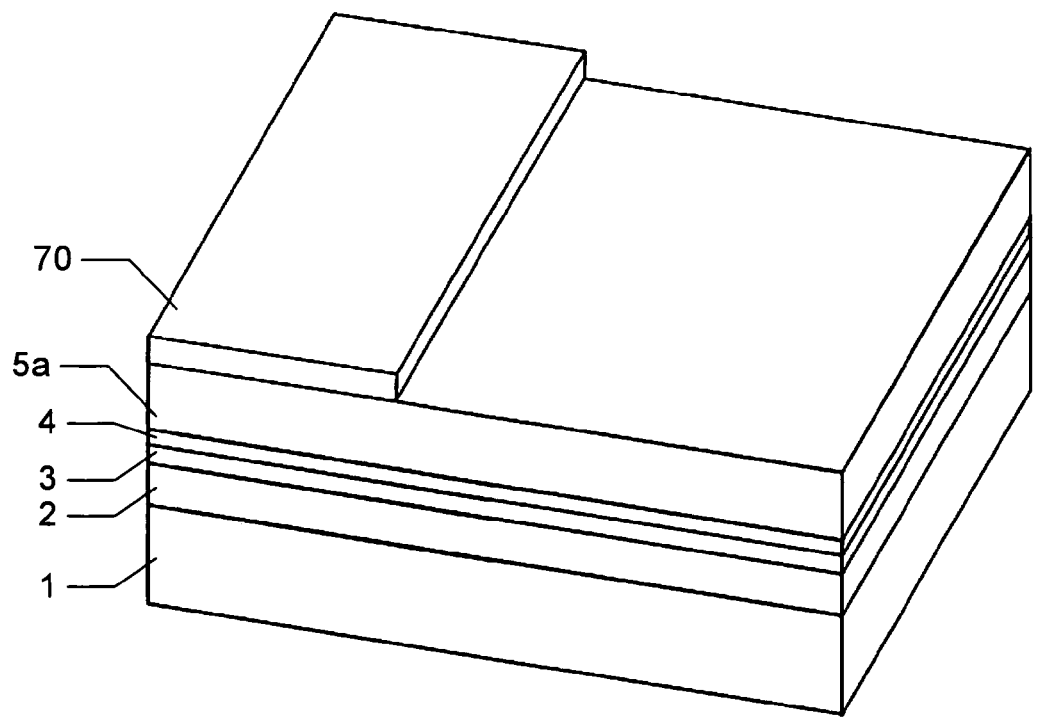

As shown in FIG. 10B, a mask pattern 70 made of $SiO_2$ is formed on the high refractive index layer 5a. The mask pattern 70 covers an area where the subsidiary diffraction grating 12 is to be formed. The mask pattern 70 is formed by well known processes including an $SiO_2$ film deposition process, a photography process and an etching process.

Figure 10C:
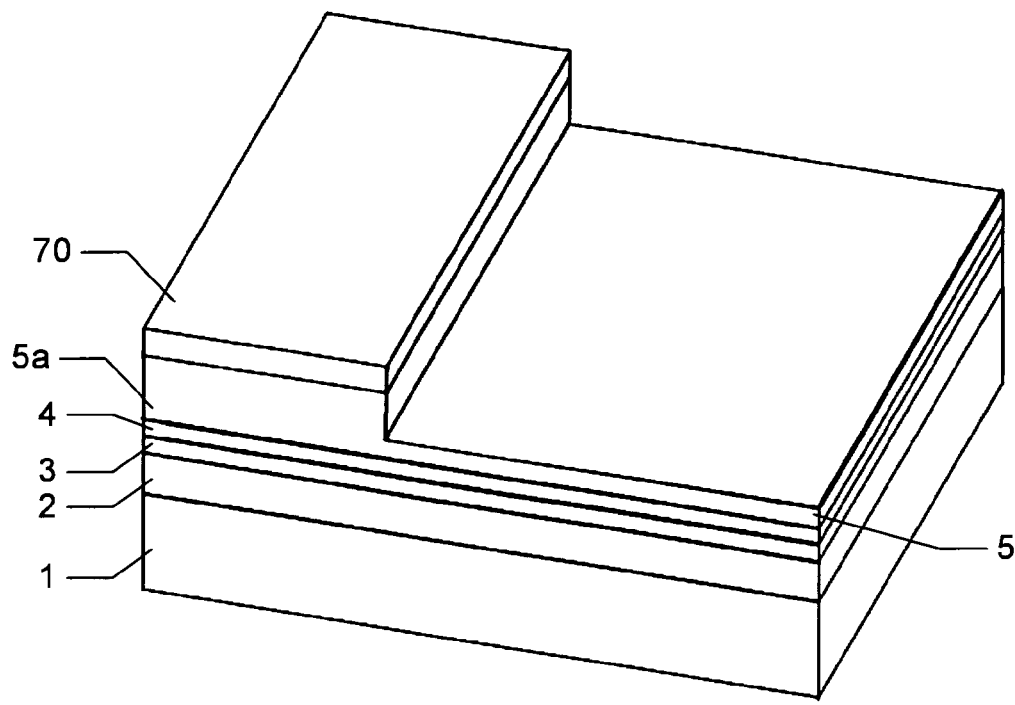

As shown in FIG. 10C, by using the mask pattern 70 as an etching mask, the high refractive index layer 5a is etched. In this case, a high refractive index layer 5a having a thickness of 50 nm remains in an area not covered with the mask pattern 70. The remaining high refractive index layer 5a constitutes part of the upper optical guide layer 5 shown in FIG. 9.

Figure 10D:
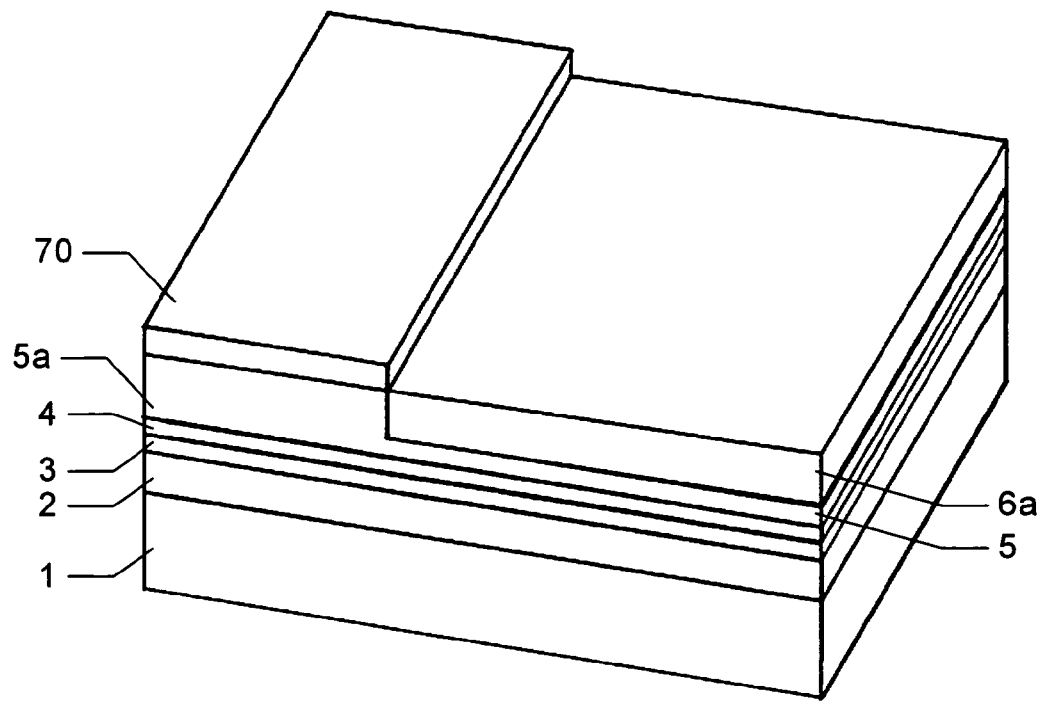

As shown in FIG. 10D, a low refractive index layer 6a made of p-type InP is selectively grown on the upper optical guide layer 5 by MOVPE. A thickness of the low refractive index layer 6a is controlled so that the upper surface of the low refractive index layer 6a is on the same level as the upper surface of the high refractive index layer 5a in the region covered with the mask pattern 70. The mask pattern 70 is thereafter removed.

Figure 10E:
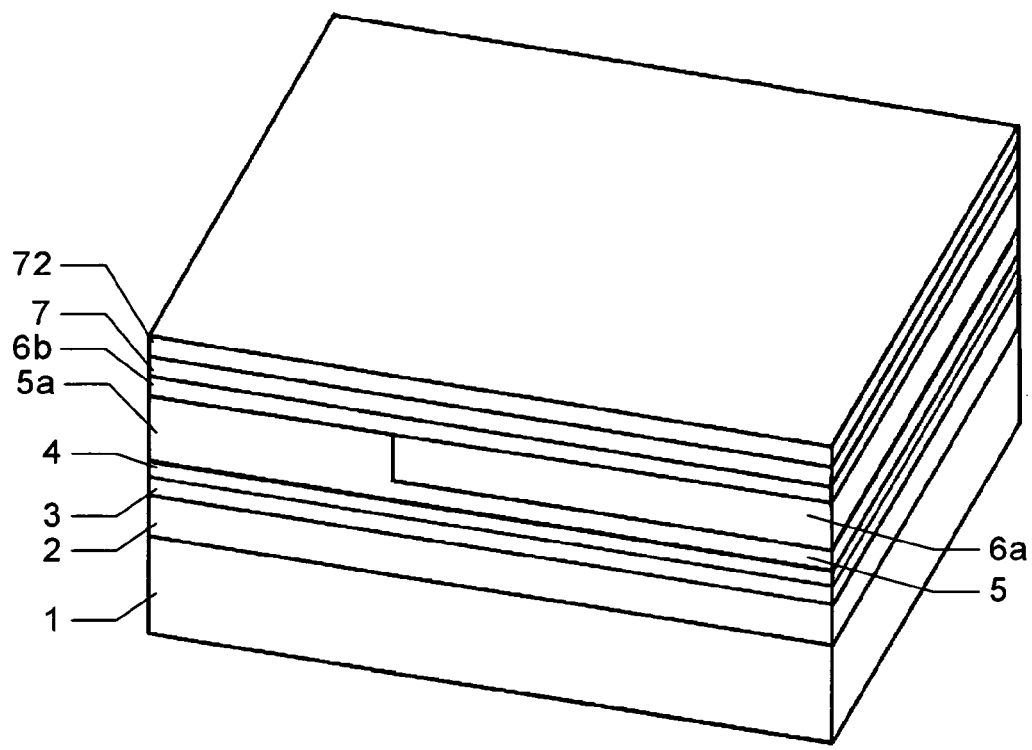

As shown in FIG. 10E, an upper cladding layer 6b made of p-type InP and having a thickness of 0.2 μm and a contact layer 7 made of p-type GaInAs and having a thickness of 0.3 μm are formed on the high refractive index layer 5a and the low refractive index layer 6a, by MOVPE. An electron beam exposure resist film 72 is formed on the contact layer 7.

Figure 10F:
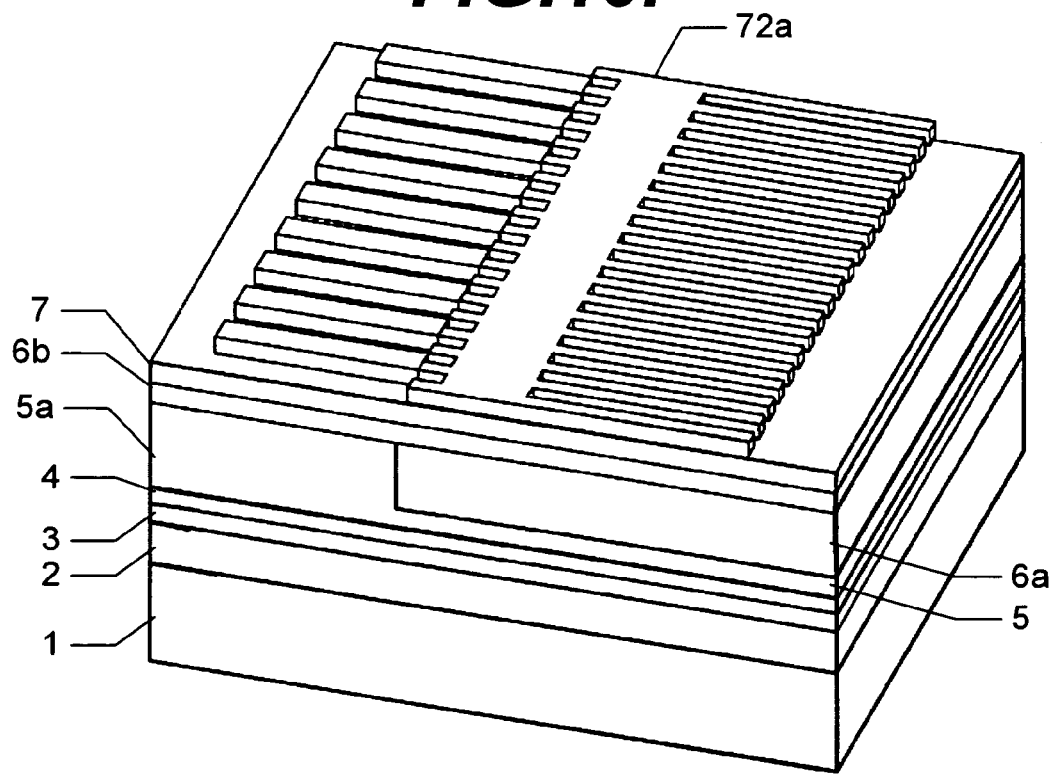

As shown in FIG. 10F, the electron beam exposure resist film 72 is exposed using electron beam direct writing technology and developed to form a resist pattern 72a. The resist pattern 72a has the same plan shape as that of the ridge-shaped cladding layer 6, main diffraction gratings 11 and subsidiary diffraction grating 12. When the resist film 72 is exposed, position alignment is performed so that the position corresponding to the border between the main and subsidiary diffraction gratings 11 and 12 coincides approximately with the border between the high refractive index layer 5a and the low refractive index layer 6a.

By using the resist pattern 72a as an etching mask, the contact layer 7, upper cladding layer 6b and high refractive index layer 5a and low refractive index layer 6a are etched. In this case, the etching is stopped at the bottom of the low refractive index layer 6a. After the etching, the resist pattern 72a is removed.

Figure 10G:
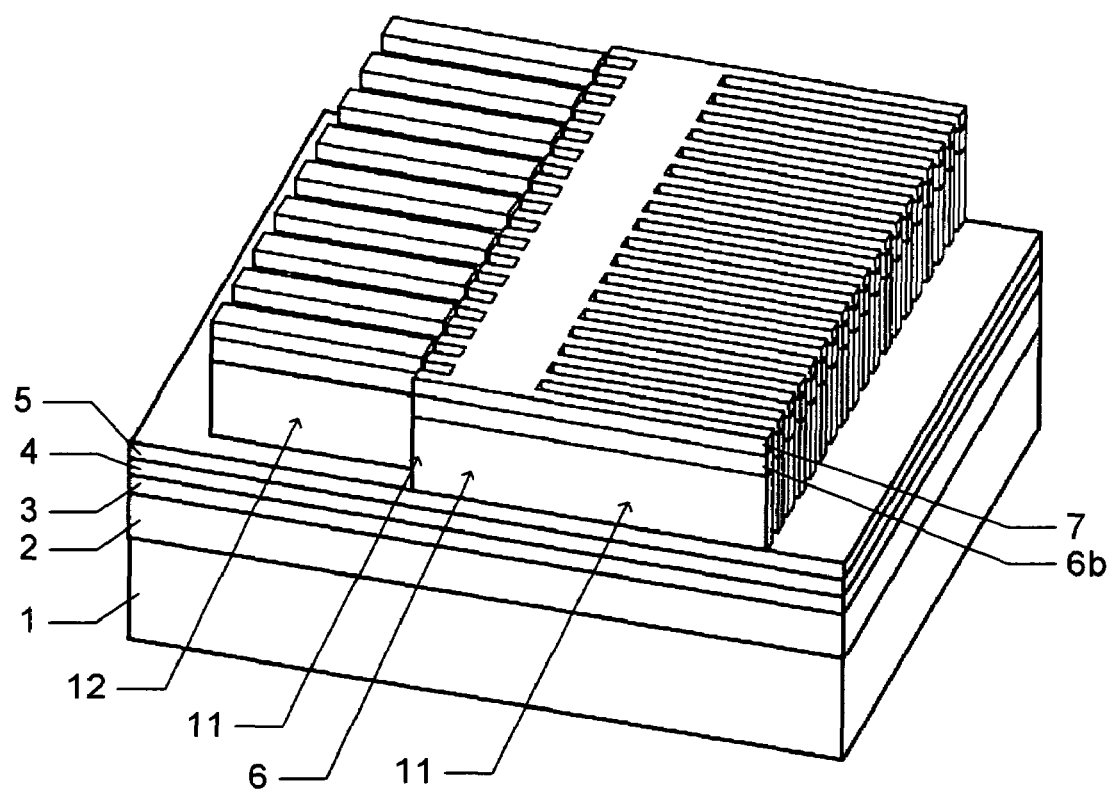

As shown in FIG. 10G, the ridge-shaped cladding layer 6, main diffraction gratings 11 and subsidiary diffraction grating 12 are therefore formed. In the region where the subsidiary diffraction grating 12 are disposed, the upper optical guide layer 5 constituted of the lower layer portion of the high refractive index layer 5a remains. The upper cladding layer 6b remains on the ridge-shaped cladding layer 6, main diffraction gratings 11 and subsidiary diffraction grating 12, and the contact layer 7 remains on the upper cladding layer 6b.

As shown in FIG. 9, the space regions of the main and subsidiary diffraction gratings 11 and 12 are filled with the burying member 23. The burying member 23 is formed also on the upper optical guide layer 5 in the areas outside the region where the main and subsidiary diffraction gratings 11 and 12 are formed. As in the case of the first embodiment, the upper and lower electrodes 14 and 15 are formed.

In the third embodiment, a refractive index difference between the first and second sides S1 and S2 is obtained by using different materials of the main and subsidiary diffraction gratings 11 and 12. The burying member 23 is therefore not essential. For example, the space regions of the main and subsidiary diffraction gratings 11 and 12 may be filled with atmospheric air.

Further, as in the case of the first embodiment, a refractive index of the burying member disposed on the first side S1 may be set higher than that of the burying member disposed on the second side S2. With this configuration, an effective refractive index difference between the first and second sides S1 and S2 is made larger so that the degree of shift of the light intensity distribution can be increased.

In the third embodiment, in FIG. 10F although the border between the high refractive index layer 5a having relatively high refractive index and low refractive index layer 6a having relatively low refractive index is made coincident with the border between the main and subsidiary diffraction gratings 11 and 12, the borders may not be made coincident. For example, the border between high refractive index layer 5a and the low refractive index layer 6a may be made coincident with the sidewall of the ridge-shaped cladding layer 6 on the first side S1. Alternatively, the border between the high refractive index layer 5a and the low refractive index layer 6a may be positioned in the area inside the main diffraction grating 11 on the first side S1 or in the area inside the subsidiary diffraction grating 12.

Figure 11:
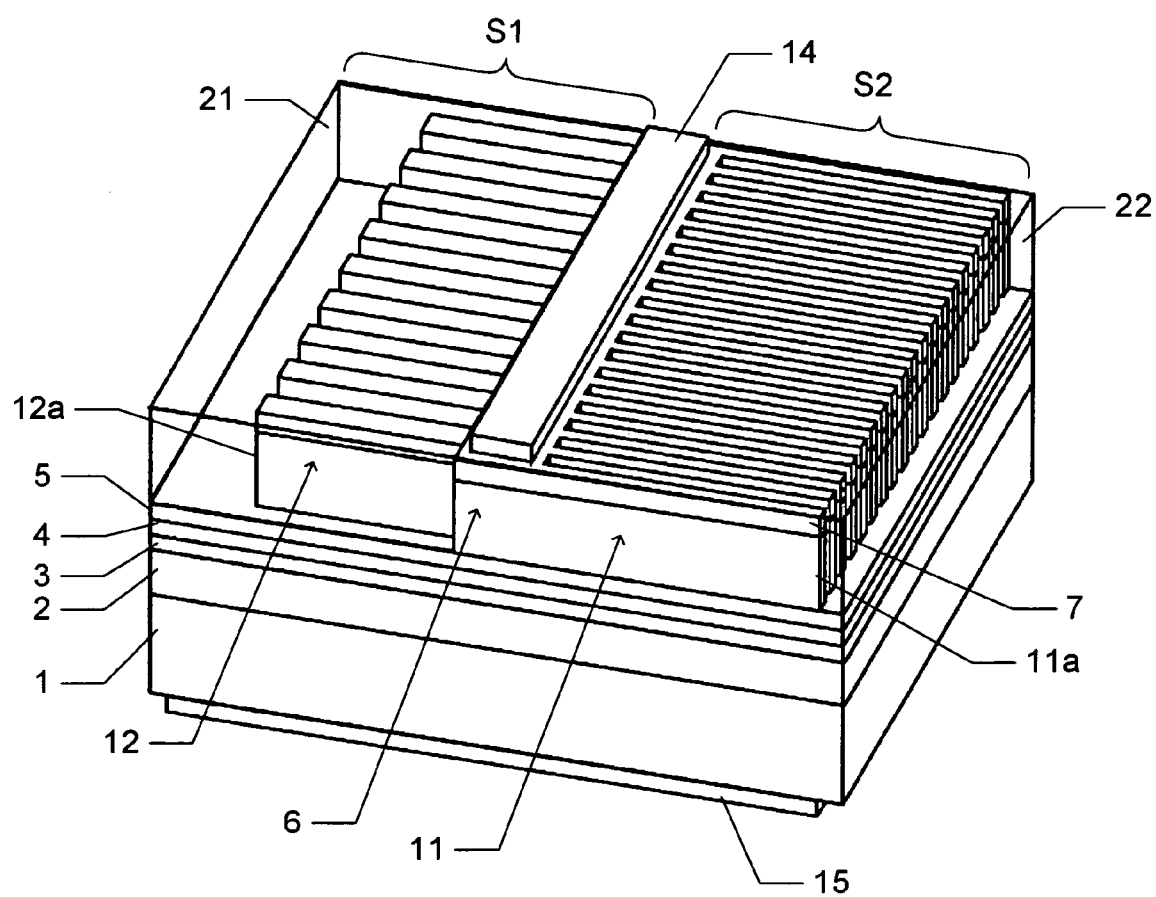
FIG. 11 is a perspective view of a ridge type laser device according to a fourth embodiment.

FIG. 11 is a perspective view of a ridge type laser device of the fourth embodiment. Description will be made by paying attention to different points from the ridge type laser device of the first embodiment shown in FIG. 4. In the first embodiment, the main diffraction grating 11 is disposed on both sides of the ridge-shaped cladding layer 6, whereas in the fourth embodiment, the main diffraction grating 11 is disposed only on the second side S2 and is not disposed on the first side S1. Therefore, each second member 12a constituting the subsidiary diffraction grating 12 protrudes outward from the sidewall of the ridge-shaped cladding layer 6. A protrusion amount from the sidewall of the ridge-shaped cladding layer 6 is, for example, 10 μm. Other structures are the same as those of the ridge type laser device of the first embodiment.

Figure 12:
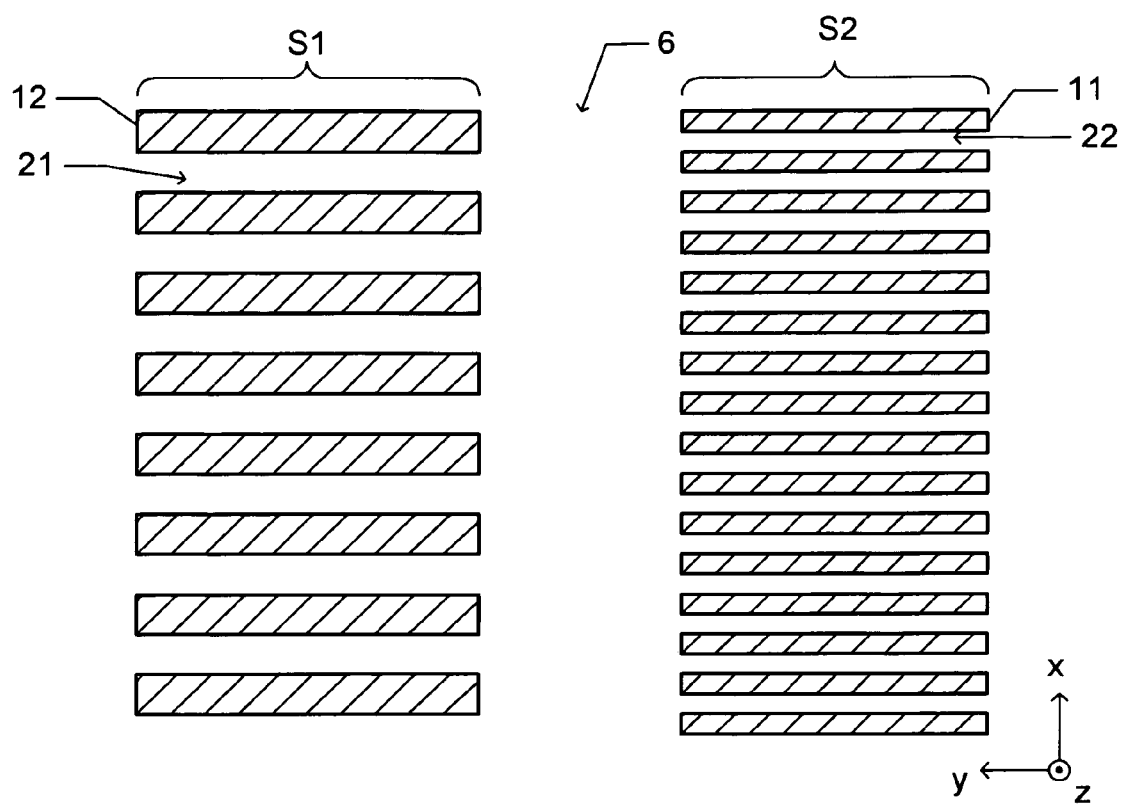
FIG. 12 is a diagram showing the positional relation between main and subsidiary diffraction gratings of the ridge type laser device of the fourth embodiment and light intensity distributions of the fundamental and second-order transverse modes.
Figure 12:
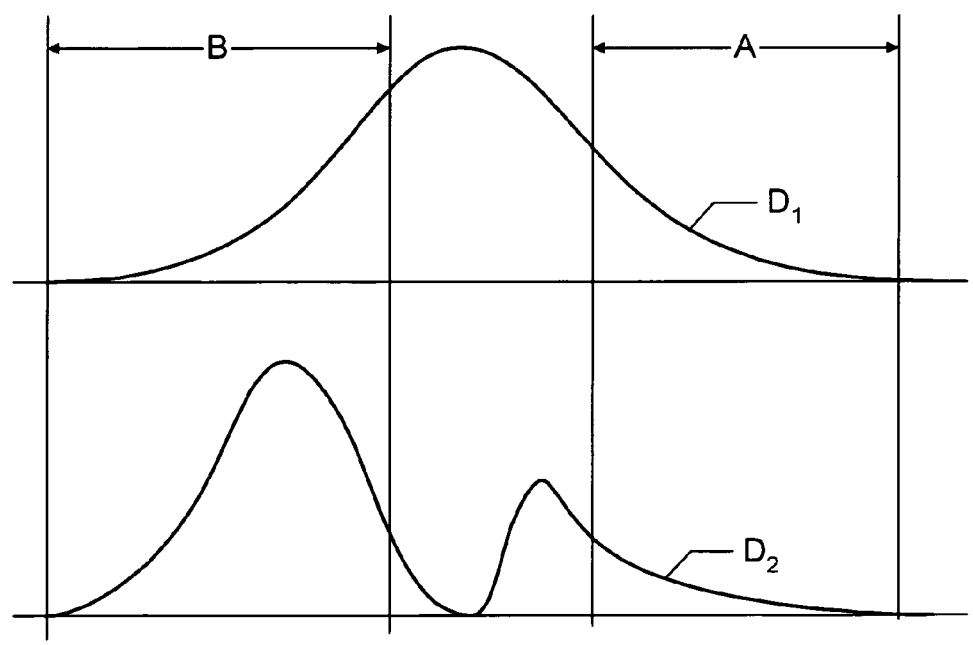

FIG. 12 shows a positional relation between a plan layout and light intensity distributions of the transverse modes of the guided wave, the plan layout signifying the ridge-shaped cladding layer 6, main diffraction grating 11 and subsidiary diffraction grating 12. The first side S1 is provided with only the subsidiary diffraction grating 12, and the second side S2 is provided with only the main diffraction grating 11. Since a refractive index of the burying member 21 on the first side S1 is higher than that of the burying member 22 on the second side S2, a light intensity distribution of guided wave propagating in the optical waveguide are biased toward the first side S1 as in the case of the first embodiment.

Since a guided wave of the fundamental transverse mode $D_1$ is biased toward the first side S1, the coupling between the fundamental mode and the subsidiary diffraction grating 12 becomes strong. However, the increasing amount of the coupling coefficient is small. In contrast, the coupling coefficient between the second-order transverse mode and the subsidiary diffraction grating 12 also increases because of the concentration of the second-order transverse mode on the first side S1, and the increasing amount is large. Therefore, as in the case of the first embodiment, a propagation loss of a guided wave of the second-order transverse mode can be made large while suppressing an increase in a propagation loss of a guided wave of the fundamental transverse mode. Oscillation of the second-order transverse mode can therefore be suppressed.

Further, as in the case of the first embodiment, the high-order transverse mode of the guided wave higher than third-order can maintain a sufficient coupling strength with the subsidiary diffraction grating 12 as well as the second transverse mode. Oscillation of the tertiary transverse mode or higher can therefore be suppressed.

The ridge type laser device of the fourth embodiment can be manufactured by making the shape of the resist pattern 50a used in the process shown in FIG. 6C of the manufacture method for the ridge type laser device of the first embodiment, match the ridge-shaped clad layer 6, main diffraction grating 11 and subsidiary diffraction grating 12 shown in FIG. 11.

In forming the diffraction grating mask pattern by interference exposure in the first embodiment, a high precision is required for position alignment between the ridge pattern 65 and the border line between the first diffraction grating pattern 60a and second diffraction grating pattern 64a, in the process shown in FIG. 7H. If there is any position misalignment therebetween, a protrusion amount of the main diffraction grating 11 on the first side S1 shown in FIG. 4 from the sidewall of the ridge-shaped cladding layer 6 varies, and desired device characteristics cannot be obtained. For example, a position alignment error is required to be smaller than 0.3 μm.

In contrast, in the fourth embodiment, in a process corresponding to that shown in FIG. 7H, it is sufficient if position alignment is performed in such a manner that the ridge pattern 65 is overlapped with the border line between the first and second diffraction grating resist patterns 60a and 64a. A large position alignment margin can therefore be ensured.

Figure 13:
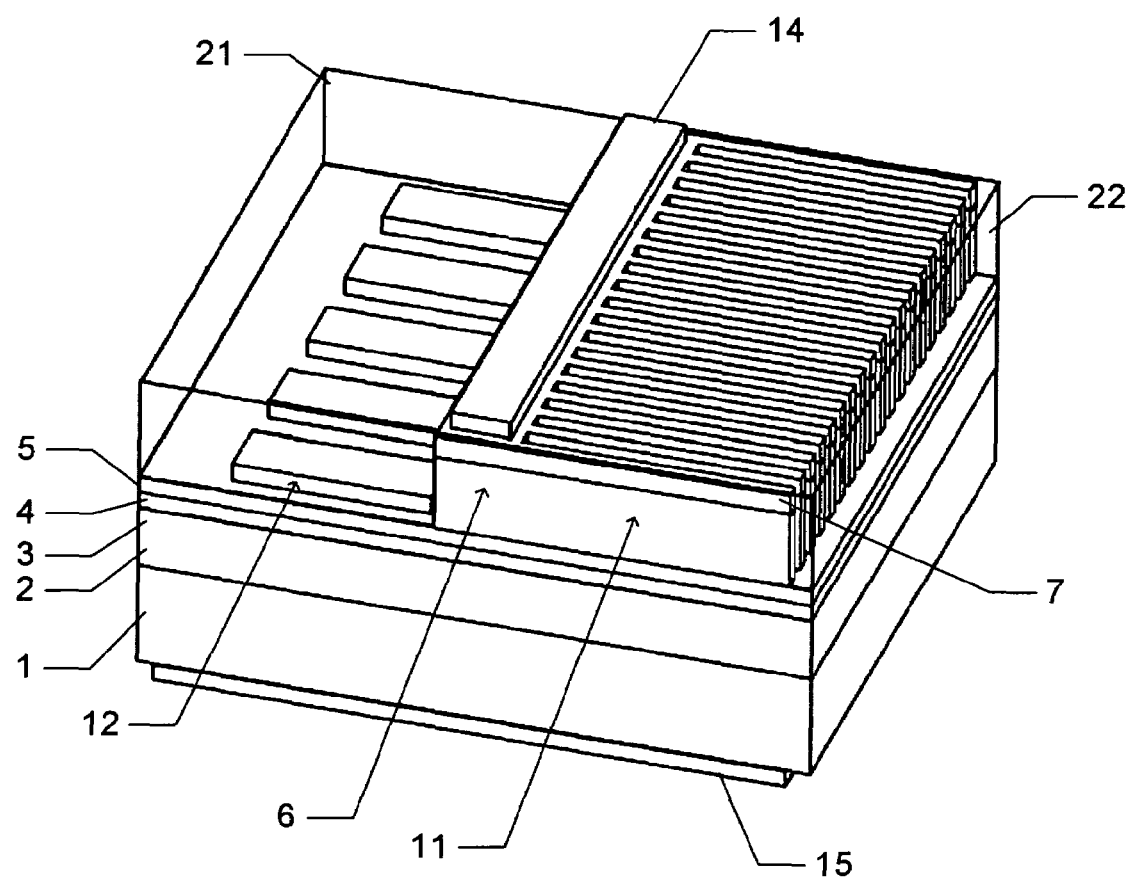
FIG. 13 is a perspective view of a ridge type laser device according to a fifth embodiment.

FIG. 13 is a perspective view of a ridge type laser device of the fifth embodiment. In the fifth embodiment, the main diffraction grating 11 is disposed only on the second side S2 of the ridge-shaped cladding layer 6, as in the case of the fourth embodiment. The subsidiary diffraction grating 12 disposed on the first side S1 is lower than the ridge-shaped cladding layer 6, as in the case of the second embodiment shown in FIG. 8.

Also in the fifth embodiment, it is apparent to those skilled in the art that advantages similar to those of the fourth embodiment can be obtained.

Figure 14:
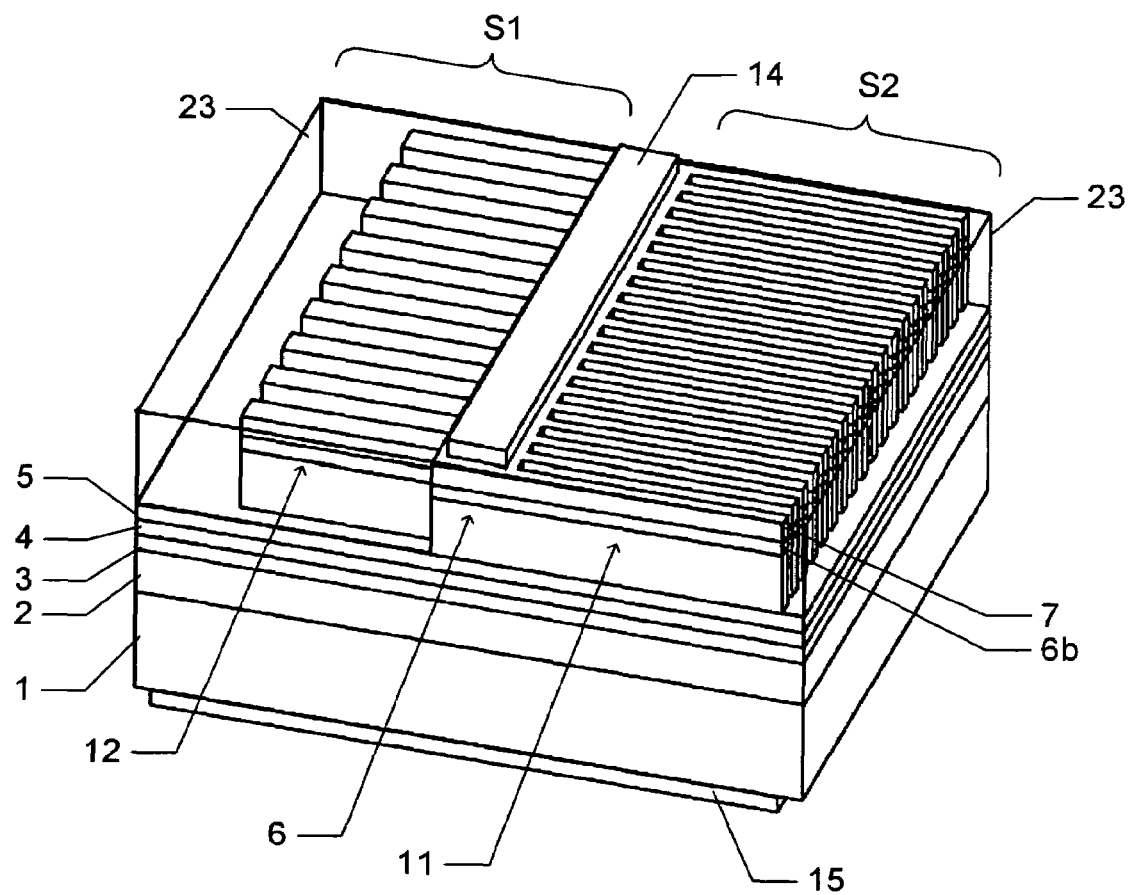
FIG. 14 is a perspective view of a ridge type laser device according to a sixth embodiment.

FIG. 14 is a perspective view of a ridge type laser device of the sixth embodiment. The ridge type laser device of the sixth embodiment has the same structure as that of the ridge type laser device of the third embodiment shown in FIG. 9, except that the main diffraction grating 11 on the first side S1 is omitted. Since the main diffraction grating on the first side S1 is omitted, the subsidiary diffraction grating 12 closes to or is in contact with the ridge-shaped cladding layer 6.

The ridge type laser device of the sixth embodiment can be manufactured in such a manner that in the process shown in FIG. 10F of the manufacture method for the ridge type laser device of the third embodiment, a region of the resist pattern 72a corresponding to the main diffraction grating 11 disposed on the first side S1 is removed, and a region of the resist pattern corresponding to the subsidiary diffraction grating 12 is connected to the region of the resist pattern corresponding to the ridge-shaped cladding layer 6. In the sixth embodiment, position alignment of the resist pattern 72a is performed in such a manner that a border line between the region of the resist pattern 72a corresponding to the ridge-shaped cladding layer 6 and the region of the resist pattern corresponding to the subsidiary diffraction grating 12 is approximately coincident with a border line between the high refractive index layer 5a and the low refractive index layer 6a.

Also in the sixth embodiment, since a light intensity distribution of the transverse modes of the guided wave can be biased toward the first side S1, similar advantages to those of the first embodiment can be obtained.

Figure 15:
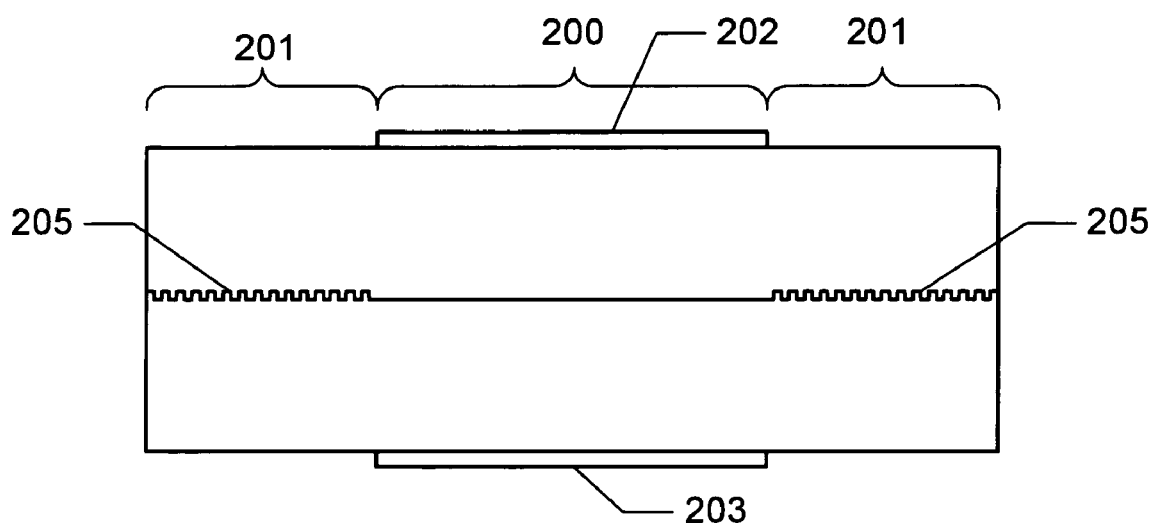
FIG. 15 is a cross sectional view of a DBR laser device according to a seventh embodiment.
Figure 16:
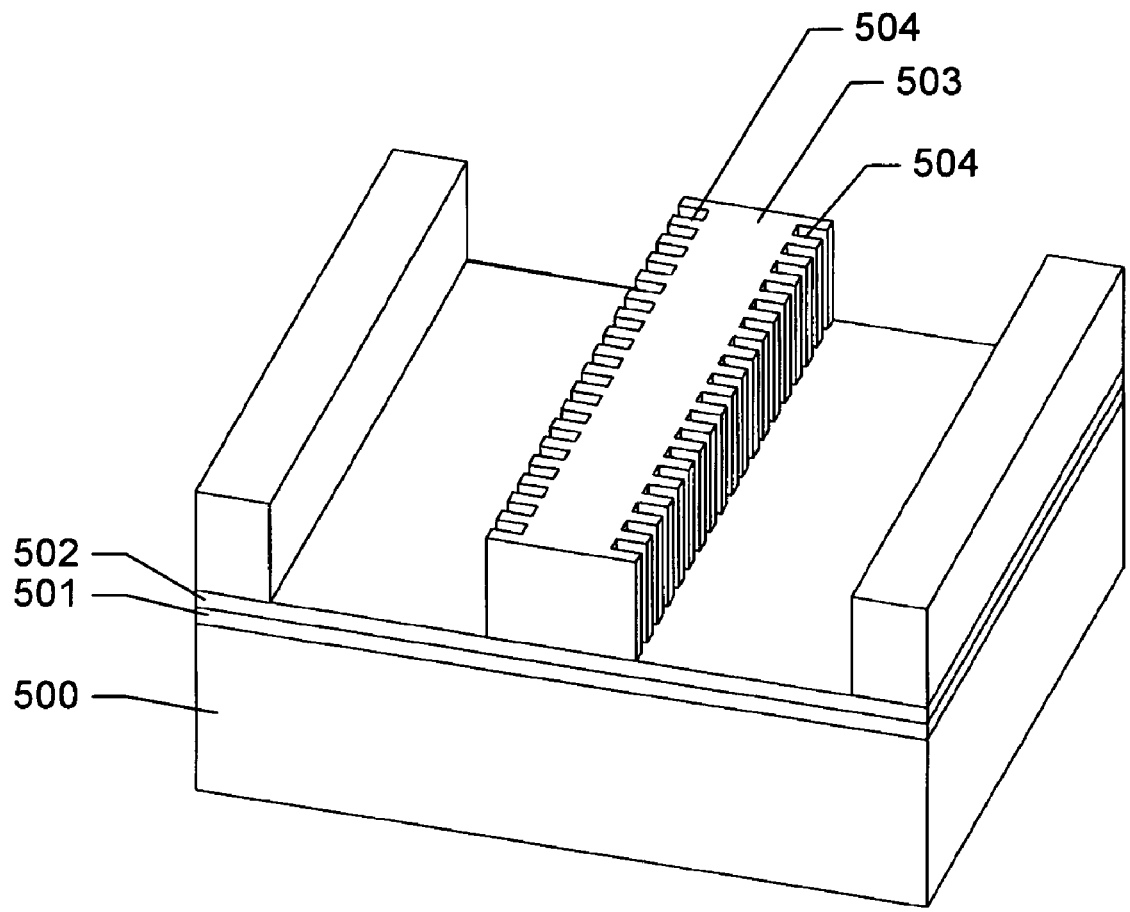
FIG. 16 is a perspective view of a conventional ridge type laser device.

FIG. 15 is a schematic cross sectional view of a laser device of the seventh embodiment. In the first to six embodiments, the laser device is a distributed feedback (DFB) laser device, and in the seventh embodiment, the laser device is a distributed Bragg reflector (DBR) laser device.

The DBR laser device of the seventh embodiment has a structure that a Bragg reflection region 201 is disposed on both sides of an amplification region 200. Carriers are injected into the amplification region from electrodes 202 and 203. A diffraction grating 205 for reflecting the guided wave is formed in each Bragg reflection region 201. The diffraction grating 205 includes main and subsidiary diffraction gratings of the laser device of one of the first to sixth embodiments.

The diffraction grating 205 in the Bragg reflection region 201 increases a loss of high-order transverse modes of the guided wave so that oscillation of high-order transverse modes can be suppressed.

Description of the embodiments has been directed to a laser device having a quantum dot active layer disposed over a GaAs substrate and a laser device having a multi quantum well active layer disposed over an InP substrate. A combination of substrate material and an active layer may be other combinations. For example, a multi quantum well active layer may be disposed over a GaAs substrate, or a quantum dot active layer may be disposed over an InP substrate.

The p-type substrate 1 is used in the first, second, fourth and fifth embodiments, and the n-type substrate 1 is used in the third and sixth embodiments. The conductivity type of the substrate may be reversed. In this case, the conductivity type of each layer above and under the active layer 4 is reversed. A semi-insulating substrate may be used, or a substrate having a structure that an underlie substrate made of desired material is put on a silicon substrate may be used. In the embodiments described above, although the optical guide layers 3 and 5 are disposed above and under the active layer 4, these optical guide layers may be omitted.

In the third embodiment, although the active layer (quantum well layer) and barrier layer are made of GaInAsP based material, these layers may be made of AlGaInAs based material. A combination of active layer material and barrier layer material may be a combination of GaInAsP based material and AlGaInAs based material.

In the first embodiment, the facet process is for the structure that a phase shifter is not introduced into the diffraction grating (the front facet has non-reflection coating, and the back facet has high reflection coating or a cleavaged facet). Alternatively, a structure may be adopted in which a λ/4 phase shifter is introduced into the diffraction grating and both facets have non-reflection coating.

In the embodiments, although $TiO_2$, $SiO_2$, BCB or the like is used as the burying member, other materials may also be used. Also in the embodiments, although the main and subsidiary diffraction gratings 11 and 12 are made of semiconductor, these gratings may be made of material other than semiconductor. For example, the subsidiary diffraction grating 12 may be made of metal such as Cr.

The present invention has been described in connection with the preferred embodiments. The invention is not limited only to the above embodiments. It will be apparent to those skilled in the art that other various modifications, improvements, combinations, and the like can be made.

What are claimed are:

1. An optical device comprising:
   an optical waveguide structure formed over a substrate, the optical waveguide structure defining an optical waveguide for guiding light along a direction parallel to a surface of the substrate, and biasing a light intensity distribution of transverse modes of guided wave toward a first side of the optical waveguide;
   a main diffraction grating disposed at least on a second side opposite to the first side among both sides of the optical waveguide, and coupled with the guided wave propagating along the optical waveguide; and
   a subsidiary diffraction grating disposed on the first side among both sides of the optical waveguide, and diffracting the guided wave that is coupled with the main diffraction grating and propagates along the optical waveguide, to a direction different from an extending direction of the optical waveguide.

2. The optical device according to claim 1, wherein a period of the subsidiary diffraction grating is at least 1.2 times as long as a period of the main diffraction grating.

3. The optical device according to claim 1, wherein the main diffraction grating is disposed also on the first side of the optical waveguide, and the subsidiary diffraction grating is disposed outside of the main diffraction grating disposed on the first side.

4. The optical device according to claim 1, wherein the optical waveguide structure comprises:
   a low cladding layer;
   a waveguide layer disposed over the lower cladding layer and having an effective refractive index higher than an effective refractive index of the lower cladding layer; and
   a ridge-shaped cladding layer disposed over the waveguide layer and having a ridge shape,
   wherein the main and subsidiary diffraction gratings are disposed beside the ridge-shaped cladding layer.

5. The optical device according to claim 3, wherein:
   the main diffraction grating comprises a first member periodically disposed, the subsidiary diffraction grating comprises a second member periodically disposed, and the first and second members are made of same material; and
   the optical waveguide structure includes a first burying member filling space regions of the diffraction grating disposed on the first side of the ridge-shaped cladding layer and a second burying member filling space regions of the diffraction grating disposed on the second side of the ridge-shaped cladding layer, and a refractive index of the first burying member is higher than a refractive index of the second burying member.

6. The optical device according to claim 5, wherein the first and second members have a same height.

7. The optical device according to claim 4, wherein a refractive index of the first burying member is at least 1.2 times as large as a refractive index of the second burying member.

8. The optical device according to claim 3, wherein the main diffraction grating comprises a first member periodically disposed, the subsidiary diffraction grating comprises a second member periodically disposed, and an effective refractive index of the second member is higher than an effective refractive index of the first member.

9. The optical device according to claim 1, wherein a duty ratio of the subsidiary diffraction grating is within a range between 35% and 65%.

10. The optical device according to claim 1, wherein an average refractive index of components on the first side of the optical waveguide is higher than that of components of the second side of the optical waveguide.

11. The optical device according to claim 1, wherein an effective refractive index on the first side affecting the guided wave is higher than that of the second side affecting the guided wave.

12. The optical device according to claim 1, wherein the light intensity distribution of transverse modes of the guided wave shifts towards the first side.

13. The optical device according to claim 1, wherein inequality (k11−k12)>(k21−k22)

is true, where k11 is a coupling coefficient between a fundamental transverse mode of the guided wave and the main diffraction grating, k12 is a coupling coefficient between the fundamental transverse mode and the subsidiary diffraction grating, k21 is a coupling coefficient between a second-order transverse mode of the guided wave and the main diffraction grating, and k22 is a coupling coefficient between a second-order transverse mode and the subsidiary diffraction grating.

14. A manufacture method for an optical device comprising steps of:
  forming, over a lower cladding layer, a waveguide layer having an effective refractive index higher than an effective refractive index of the lower cladding layer;
  forming, over the waveguide layer, an upper cladding layer having an effective refractive index higher than an effective refractive index of the waveguide layer;
  forming a first diffraction grating pattern having periodicity in a first direction, over the upper cladding layer, by interference exposure;
  covering the first diffraction grating pattern disposed in a region on one side of a border line parallel to the first direction, with a mask film;
  removing the first diffraction grating pattern in a region not covered with the mask film;
  forming a second diffraction grating pattern having periodicity along the first direction over the upper cladding layer and the mask film, by interference exposure;
  removing the mask film together with the second diffraction grating pattern formed thereon;
  forming a ridge pattern covering a stripe area extending in the first direction, the ridge pattern superposing at least partially upon the first diffraction grating; and
  etching the upper cladding layer by using as an etching mask the first and second diffraction grating patterns and the ridge pattern.

15. The manufacture method for an optical device according to claim 14, wherein the ridge pattern is disposed in a region on one side of the border line where the first diffraction grating pattern is formed, and the first diffraction grating pattern is exposed on both sides of the ridge pattern.

16. The manufacture method for an optical device according to claim 14, wherein the ridge pattern is overlapped with the border line.

* * * * *